US010505325B2

(12) United States Patent  
Duncan et al.

(10) Patent No.: US 10,505,325 B2  
(45) Date of Patent: Dec. 10, 2019

(54) FLEXIBLE AND CONFIGURABLE RACK POWER DISTRIBUTION UNIT

(71) Applicant: SCHNEIDER ELECTRIC IT CORPORATION, West Kingston, RI (US)

(72) Inventors: Brian Lee Duncan, Highland, IL (US); Martin Guy Fiacco, Dardenne Prairie, MO (US)

(73) Assignee: SCHNEIDER ELECTRIC IT CORPORATION, West Kingston, RI (US)

( * ) Notice: Subject to any disclaimer, the term of this patent is extended or adjusted under 35 U.S.C. 154(b) by 0 days.

(21) Appl. No.: 15/783,088

(22) Filed: Oct. 13, 2017

(65) Prior Publication Data

US 2019/0115705 A1    Apr. 18, 2019

(51) Int. Cl.  
*H01R 25/16* (2006.01)  
*H05K 7/14* (2006.01)  
*H01R 27/02* (2006.01)  
*H01R 25/00* (2006.01)  
*H01R 27/00* (2006.01)

(52) U.S. Cl.  
CPC ......... *H01R 25/165* (2013.01); *H01R 25/006* (2013.01); *H01R 27/00* (2013.01); *H01R 27/02* (2013.01); *H05K 7/14* (2013.01); *H05K 7/1492* (2013.01)

(58) Field of Classification Search  
CPC .. H01R 25/006; H01R 23/025; H01R 13/518; H01R 25/165; H01R 27/02; H01R 27/00; H05K 7/1492; H05K 7/14

USPC ............... 439/76.1, 540.1, 535, 536  
See application file for complete search history.

(56) References Cited

U.S. PATENT DOCUMENTS

| | | | | |
|---|---|---|---|---|
| 5,281,154 A | * | 1/1994 | Comerci | H01F 27/06 336/107 |
| 7,416,442 B1 | * | 8/2008 | Liu | H01R 24/64 439/540.1 |
| 9,843,146 B1 | * | 12/2017 | Chen | H01R 13/7172 |
| 2007/0128927 A1 | * | 6/2007 | Cleveland | H01R 13/68 439/535 |
| 2012/0307421 A1 | * | 12/2012 | Ewing | H01R 25/006 361/622 |
| 2013/0196535 A1 | * | 8/2013 | Utz | H01R 23/6866 439/536 |
| 2013/0267116 A1 | * | 10/2013 | Tin | H02J 1/00 439/535 |

(Continued)

OTHER PUBLICATIONS

Partial European Search Report from corresponding European Application No. 18198327.1 dated Feb. 7, 2019.

(Continued)

*Primary Examiner* — Gary F Paumen  
(74) *Attorney, Agent, or Firm* — Lando & Anastasi, LLP

(57) ABSTRACT

A rack power distribution unit is provided having one or more outlet modules. Each outlet module includes a body having a plurality of outlet openings. A plurality of outlets are configured to be inserted into, and retained within, the plurality of outlet openings. An outlet board is configured to be coupled to, and distribute power to, the plurality of outlets. A control board configured to be coupled to, and distribute power to, the outlet board, where the outlet board is configured to be coupled to a first outlet of a first type and a second outlet of a second type.

19 Claims, 22 Drawing Sheets

(56) References Cited

U.S. PATENT DOCUMENTS

2014/0111908 A1    4/2014  Ewing et al.
2014/0126116 A1*   5/2014  Irons ................... H05K 7/1492
                                                          361/622

OTHER PUBLICATIONS

Extended European Search Report from corresponding European Application No. 18198327.1 dated May 9, 2019.

* cited by examiner

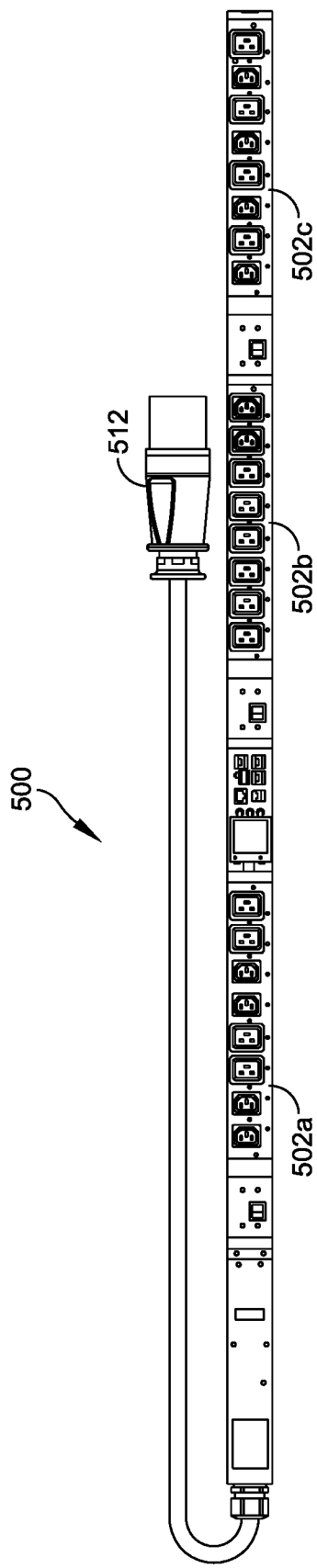

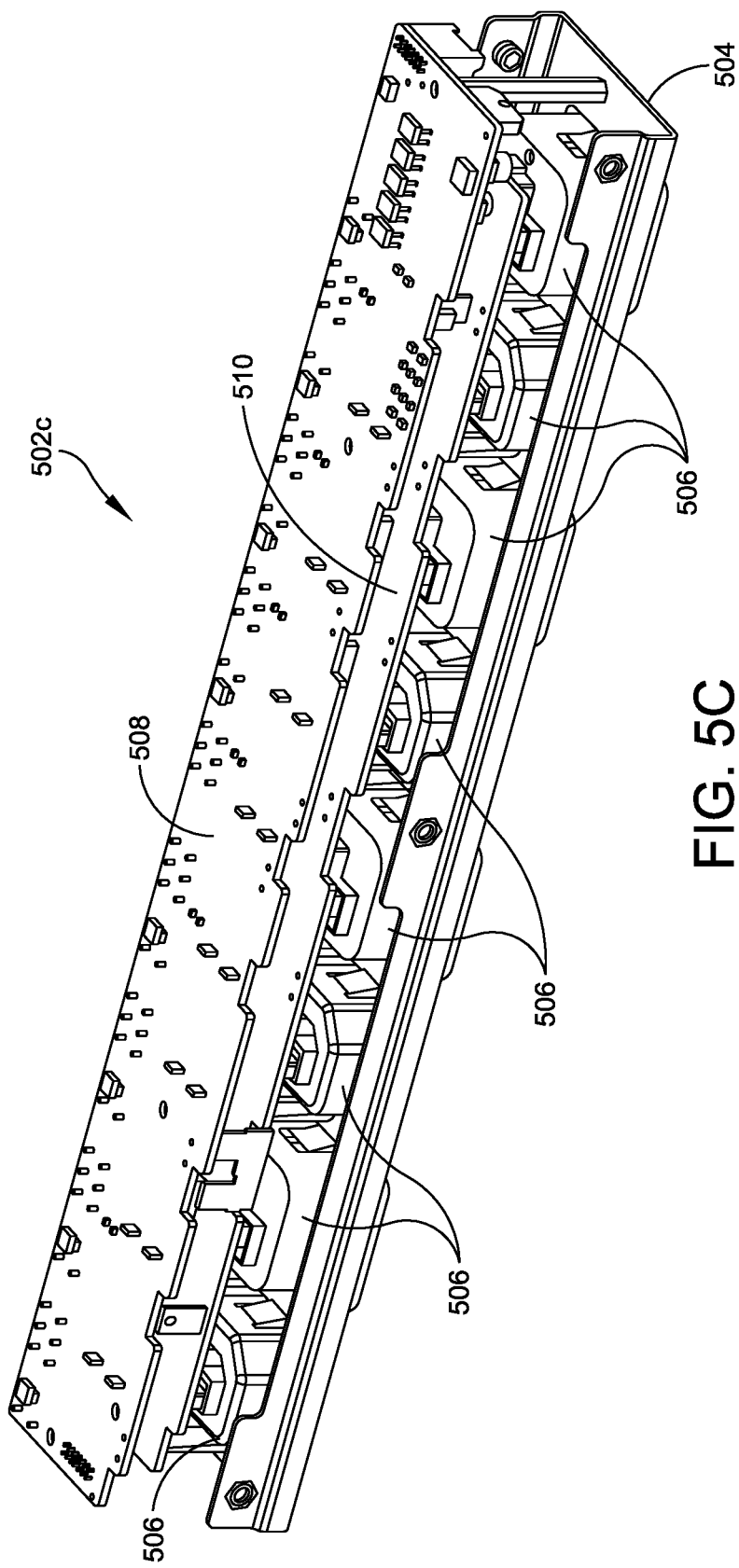

FLEXIBLE AND CONFIGURABLE RACK POWER DISTRIBUTION UNIT

BACKGROUND

1. Technical Field

Aspects and embodiments of the present invention are directed generally to electronic equipment mounting racks, and more specifically, to power distribution units contained therein.

2. Discussion of Related Art

In response to the increasing demands of information-based economies, information technology networks continue to proliferate across the globe. One manifestation of this growth is the centralized network data center. A centralized network data center typically consists of various information technology equipment, co-located in a structure that provides network connectivity, electrical power, and cooling capacity. Often the equipment is housed in specialized enclosures termed "racks" which integrate these connectivity, power and cooling elements.

Equipment racks may include power distribution and wire management systems coupled to the racks to supply power and communication lines to the equipment in the racks. A type of power distribution system often used in electronic equipment racks, referred to as a "Rack Power Distribution Unit" or "rPDU," includes multiple electrical outlets of the same or different specification for supplying power to equipment in a rack. One or more rPDUs may be mounted, for example, on one or both sides of the rear of a rack.

SUMMARY

According to one aspect of the present invention a rack power distribution unit is provided having one or more outlet modules. Each outlet module includes a body or faceplate having a plurality of outlet openings. A plurality of outlets are configured to be inserted into, and retained within, the plurality of outlet openings. An outlet board (e.g., an Outlet Printed Circuit Board [PCB] assembly) herein referred to as an outlet board, is configured to be coupled to, and distribute power to, the plurality of outlets. A control board (e.g., a control Printed Circuit Board [PCB] assembly) herein referred to as a control board, is configured to be coupled to, and distribute power to, the outlet board, where the outlet board is configured to be coupled to a first outlet of a first type and a second outlet of a second type.

The plurality of outlet openings may configured to accommodate at least 256 different configurations of outlet openings. The plurality of outlet receptacles may include an IEC320-C13 type outlet and an IEC320-C19 type outlet, otherwise referred to as C13 type outlet and C19 type outlet respectfully. The plurality of outlet openings may include a first outlet opening configured to receive the C13 type outlet, and a second outlet opening configured to receive the C19 type outlet. The outlet board may include a plurality of groups of female terminals, each group of female terminals including a first set of female terminals configured to be coupled to the first outlet of the first type, and a second set of female terminals configured to be coupled to the second outlet of the second type. Each outlet of the plurality of outlets types may include a locking tab configured to allow a respective outlet to be inserted into a respective outlet opening of the plurality of outlet openings and to prevent the respective outlet from being removed from the respective outlet opening of the outlet module.

In some embodiments, an outlet adapter may be provided and is configured to be inserted into, and retained within, a respective outlet opening of the plurality of outlet openings. The outlet adapter may be configured to enable the first outlet of the first type to be inserted into an outlet opening of the plurality of outlet openings configured to receive the second outlet of the second type. The outlet adapter may include a locking tab configured to allow the adapter to be inserted into a respective outlet opening of the plurality of outlet openings and prevent the adapter from being removed from the respective outlet opening. Each of the plurality of outlet openings may be substantially identical in size, and each outlet opening of the plurality of outlet openings may be configured to receive one of the outlet adapters and the second outlet of the second type. One or more outlet modules may include a plurality of rows of outlets.

Another aspect of the disclosure is directed to a rack power distribution unit including at least one outlet module. The at least one outlet module may include a body. The body may include a plurality of outlets. The at least one outlet module may include means for receiving, and retaining, the plurality of outlets, and means for distributing power received from a power source to the plurality of outlets. The means for distributing power may be configured to coupled to a first outlet of a first type and a second outlet of a second type.

The plurality of outlets may include a C13 type outlet and a C19 type outlet. The means for receiving, and retaining, the plurality of outlets may include means for receiving and retaining the C13 type outlet, and means for receiving and retaining the C19 type outlet. Each outlet of the plurality of outlets may include a locking tab configured, in combination with the means for receiving and retaining the plurality of outlets, to allow a respective outlet to be received by the means for receiving and retaining the plurality of outlets and to prevent the respective outlet from being removed from the means for receiving and retaining the plurality of outlets. The means for receiving and retaining the plurality of outlets may include means for receiving and retaining an outlet of the first type, further comprising means for adapting an outlet of the second type to be received and retained by the means for receiving and retaining the outlet of the first type.

The outlet of the first type may be a C19 type outlet, and the outlet of the second type may be a C13 type outlet. The means for adapting an outlet of the second type to be received and retained by the means for receiving and retaining the outlet of the first type may include means for allowing the means for adapting an outlet of the second type to be received and retained by the means for receiving and retaining the outlet of the first type to be inserted into the means for receiving, and retaining, the plurality of outlets and for preventing the means for adapting an outlet of the second type to be received and retained by the means for receiving and retaining the outlet of the first type from being removed from the means for receiving, and retaining, the plurality of outlets. The at least one outlet module may include a plurality of rows of outlets.

Another aspect of the disclosure is directed to an outlet adapter to enable an outlet of a first type to be inserted into an outlet opening configured to receive an outlet of a second type. The outlet adapter may include a body having a lip to prevent the outlet adapter from passing through the outlet opening. The outlet adapter may further include a cavity formed in the body to receive the outlet of the first type. The outlet adapter may further include a first locking tab to allow the outlet adapter to be inserted into the outlet opening and prevent the outlet adapter from being removed from the outlet opening. The outlet adapter may further a cavity that accepts the locking tab of the outlet of the first type to be inserted into the cavity and prevent the outlet of the first type from being removed from the outlet adapter. The outlet adapter may be configured to receive a C13 type outlet or a 5-20R type outlet, and the outlet opening may be configured to receive a C19 type outlet.

Another aspect of the disclosure is directed to a method of constructing a rack power distribution unit including a main body. The method can include receiving, from a manufacturer, an outlet module faceplate. The method can further include receiving, from a customer, outlet arrangement specifications. The method can further include stamping, responsive to receiving the outlet arrangement specifications, a plurality of outlet openings in the outlet module faceplate. The method can further include inserting a respective outlet of a plurality of outlets into each outlet opening of the plurality of outlet openings. The method can further include coupling an outlet board to the plurality of outlets. The method can further include coupling the control board to an outlet board. The method can further include coupling the outlet module to the main body of the rack power distribution unit.

BRIEF DESCRIPTION OF DRAWINGS

The accompanying drawings are not intended to be drawn to scale. In the drawings, each identical or nearly identical component that is illustrated in various figures is represented by a like numeral. For purposes of clarity, not every component may be labeled in every drawing. In the drawings:

FIG. 5A illustrates a top view of an rPDU according to one embodiment;

FIG. 5C illustrates a bottom perspective view of the rPDU outlet module according to one embodiment;

DETAILED DESCRIPTION

Embodiments of the present disclosure are directed generally to a flexible and configurable rack Power Distribution Unit (rPDU) capable of providing power via outlets of the same or a different type arranged according to any configuration. The flexible and configurable rPDU can be easily adapted to customer specifications identifying an arrangement of outlet types, and provides significant reductions in fabrication time, complexity, and cost.

Examples of the methods and systems discussed herein are not limited in application to the details of construction and the arrangement of components set forth in the following description or illustrated in the accompanying drawings. The methods and systems are capable of implementation in other embodiments and of being practiced or of being carried out in various ways. Examples of specific implementations are provided herein for illustrative purposes only and are not intended to be limiting. In particular, acts, components, elements and features discussed in connection with any one or more examples are not intended to be excluded from a similar role in any other examples.

Also, the phraseology and terminology used herein is for the purpose of description and should not be regarded as limiting. Any references to examples, embodiments, components, elements or acts of the systems and methods herein referred to in the singular may also embrace embodiments including a plurality, and any references in plural to any embodiment, component, element or act herein may also embrace embodiments including only a singularity. References in the singular or plural form are not intended to limit the presently disclosed systems or methods, their components, acts, or elements. The use herein of "including," "comprising," "having," "containing," "involving," and variations thereof is meant to encompass the items listed thereafter and equivalents thereof as well as additional items. References to "or" may be construed as inclusive so that any terms described using "or" may indicate any of a single, more than one, and all of the described terms. In addition, in the event of inconsistent usages of terms between this document and documents incorporated herein by reference, the term usage in the incorporated references is supplementary to that of this document; for irreconcilable inconsistencies, the term usage in this document controls.

Figure 1:
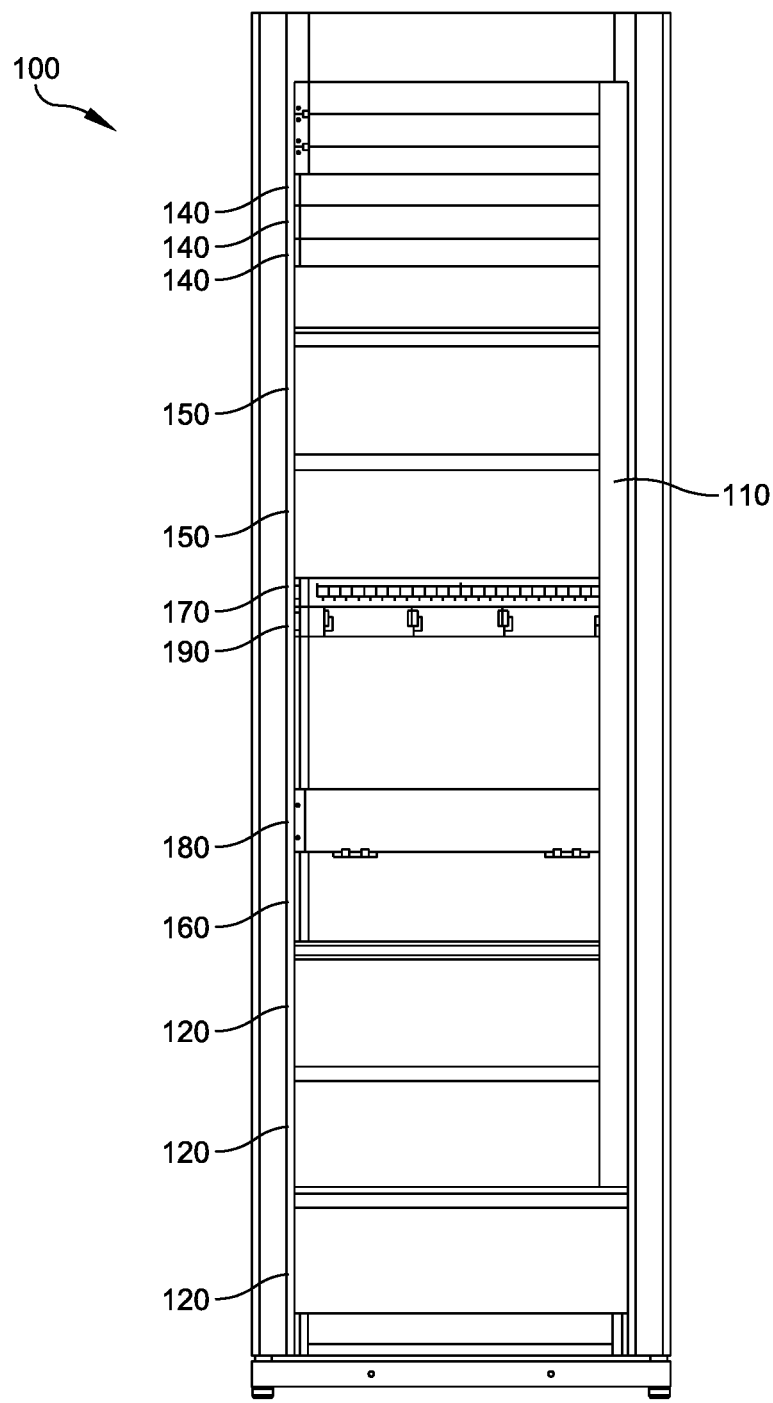
FIG. 1 illustrates a rear view of an electronic equipment rack.

A simplified rear view of an electronic equipment rack (also referred to herein simply as a "rack") is illustrated in FIG. 1, generally at 100. The doors of the rack 100 are omitted from FIG. 1 for clarity. The rack may include drawer enclosures, each respectively indicated at 120, including items that support power and/or network connections for other equipment mounted in the rack. Uninterruptible Power Supplies (UPSs), each indicated at 140, may be installed as rack mounted devices to increase the power supply redundancy of the rack. The rack 100 may include computing or network technology equipment, for example, one or more data storage devices, each indicated at 150, a server 160, a patch panel 170, a keyboard tray 180, a cable organizer 190, and/or a monitor or other user interface which may provide for an operator to communicate with the equipment in the rack. The rack may be configured in any manner desired by the end user.

An rPDU 110 may be mounted internal to the rack 100. The rPDU 110 may be vertically mounted, as illustrated in FIG. 1, or may be horizontally mounted in the rack along with the other equipment in the rack. Although one rPDU 110 is shown and described, two or more rPDU's may be provided in the rack. The rPDU 110 may receive power from the UPSs 140 in the rack, or directly from an AC utility supply, and may include power outlets to which power cords from the various other equipment in the rack may be electrically connected.

The rPDU 110 may include outlets of a single type, or of varied types, configured to receive a plug of a corresponding type. As will be understood by one of ordinary skill in the art, International Electrotechnical Commission (IEC) 60320 defines a set of standards for general-purpose plug-and-outlet pairs. For example, the IEC 320-C19/C20 standard identifies an outlet and a plug, respectively, typically employed in higher-current applications, such as in providing power to a UPS. A first conventional embodiment of the rPDU 110 is illustrated below with respect to FIGS. 2 and 3, and a second conventional embodiment of the rPDU 110 is illustrated below with respect to FIG. 4.

Figure 2:
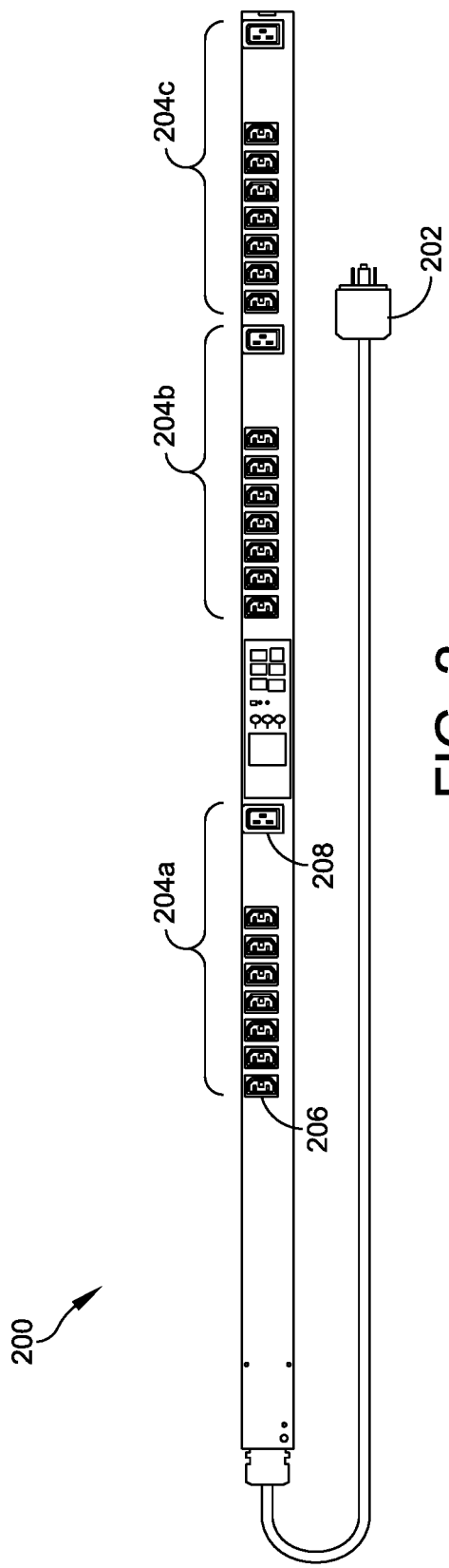
FIG. 2 illustrates a top view of a conventional rack Power Distribution Unit (rPDU)

FIG. 2 illustrates one example of an rPDU 200 including outlets of varied types. The rPDU 200 includes a plug 202 and several outlet banks 204a-204c. Each outlet bank of the outlet banks 204a-204c includes a total of eight outlets in one of two types. For example, a first outlet bank 204a includes a first outlet 206 of a first type, and a second outlet 208 of a second type. As will be understood by one of ordinary skill in the art, the first outlet 206 is defined by IEC 60320 as an IEC 320-C13 outlet (hereinafter, a C13 type outlet) configured to receive an IEC 320-C14 plug (hereinafter, a C14 type plug), and the second outlet 208 is defined by IEC 60320 as an IEC 320-C19 outlet (hereinafter a C19 type outlet) configured to receive an IEC 320-C20 plug (hereinafter a C20 type plug). In normal operation, the rPDU 200 is configured to receive power via the plug 202 which is connected, for example, to an AC mains power supply or to a UPS, such as the UPS 140 provided in the rack 100. The power received via the plug 202 is distributed to each outlet in the outlet banks 204a-204c to provide power to devices connected thereto (not illustrated).

Each outlet bank of the outlet banks 204a-204c may be subject to certain specifications or requirements. For example, there may be minimum spacing requirements between outlets as a function of the outlet type. A minimum center-to-center (CTC) spacing between two outlets of the same type may be different than a minimum CTC spacing between two outlets of different types. For example, a minimum CTC between two C13 type outlets, such as two adjacent C13 type outlets in the first outlet bank 204a, may be 1.4 in., whereas a larger minimum CTC may exist between a C13 type outlet and a C19 type outlet (e.g., a 1.6 in. minimum CTC distance). Accordingly, it may be difficult to replace a C13 type outlet with a C19 type outlet without violating certain design specifications or requirements because there may not be enough physical space to accommodate the C19 type outlet.

Figure 3:
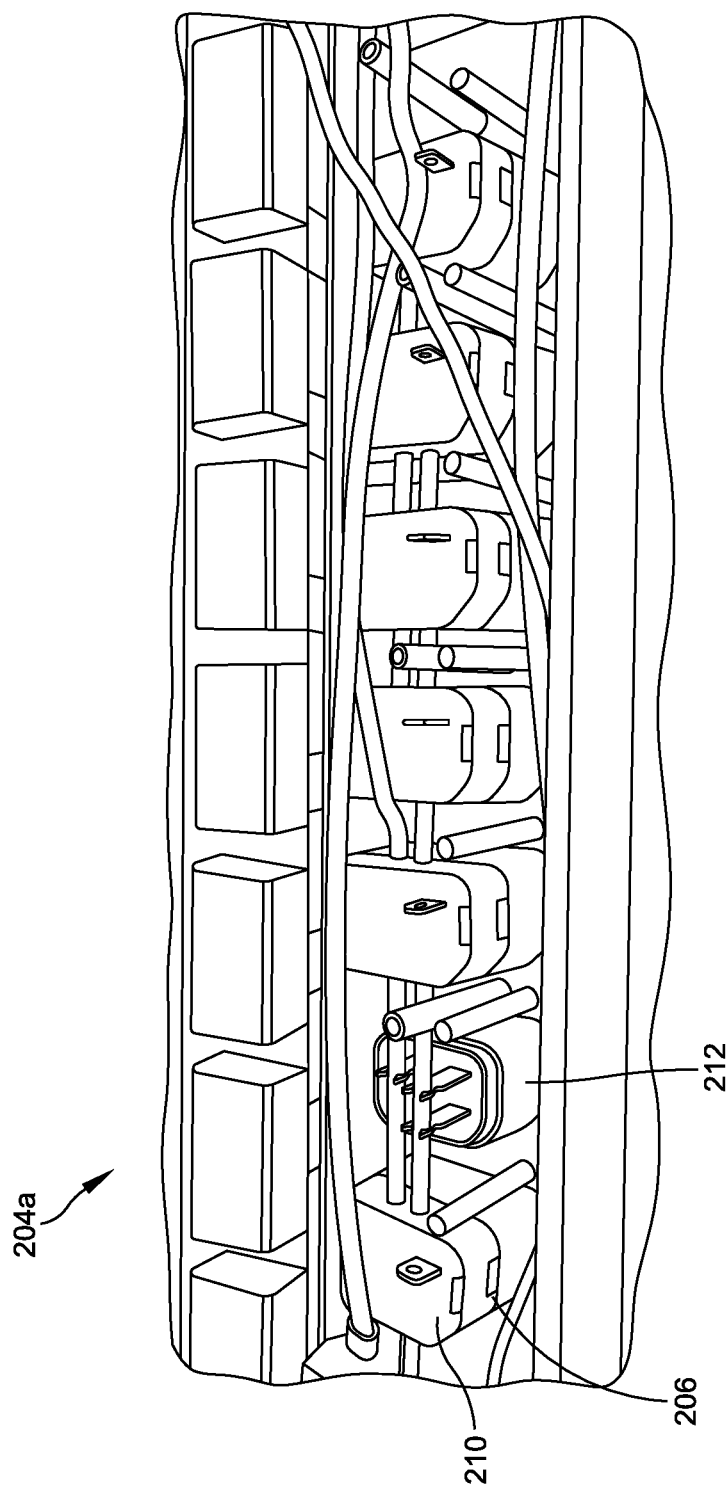
FIG. 3 illustrates a perspective inside view of a portion of the conventional rPDU.

FIG. 3 illustrates an inside view of the first outlet bank 204a. As illustrated by FIG. 3, several wires are required to route power to the first outlet banks 204a, and to route control signals between the first outlet bank 204a and a control board (e.g., a PCB). As illustrated by FIG. 3, organizing the arrangement of the wires may be challenging.

The first outlet 206 of the first type (e.g., a C13 type outlet) includes a back cap 210 affixed to the back of the first outlet 206 to prevent dislodging of wires from their Insulation Displacement Connection (IDC) terminals and to prevent live connections from being exposed. However, as illustrated by a second outlet 212 of the first type (e.g., a C13 type outlet), the back cap may become inadvertently dislodged or removed, causing inadvertent dislodging of wires or exposure of the live connections of the second outlet 212.

Figure 4:
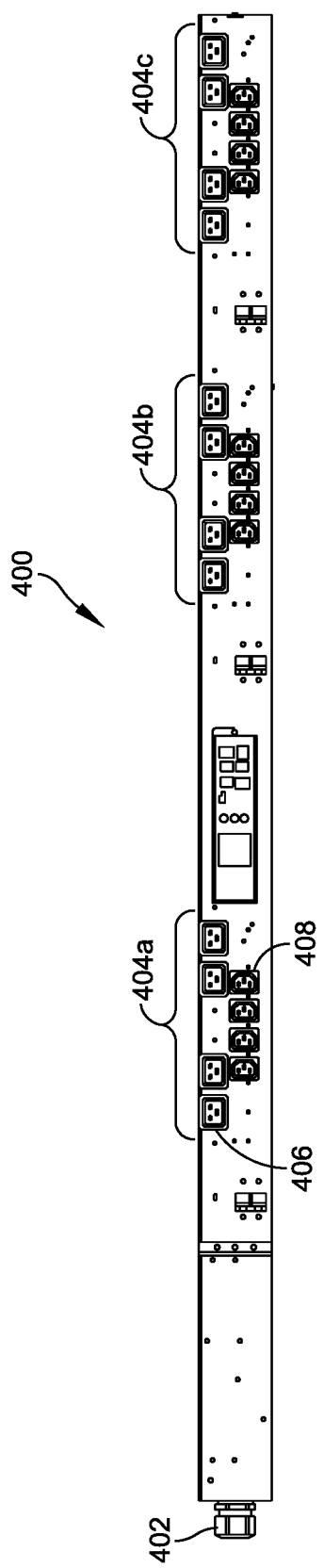
FIG. 4 illustrates a top view of a conventional rPDU according to another example.

FIG. 4 illustrates another example of an rPDU, generally indicated at 400, including outlets of varied types. The rPDU 400 includes a strain relief 402 and several outlet banks 404a-404c, arranged in two rows. For example, a first row of a first outlet bank 404a includes a first outlet 406 of a first type (i.e., a C19 type outlet) and a second row of the first outlet bank 404a includes a second outlet 408 of a second type (i.e., a C13 type outlet). The rPDU 400 may be referred to as a "double wide chassis" by virtue of having two rows of outlets, whereas the rPDU 200 described above with respect to FIGS. 2 and 3 may be referred to as a "single wide chassis" by virtue of having a single row of outlets. The rPDU 400 adds flexibility relative to the rPDU 200 because, by segregating outlet types by row, outlets of a specific type may be added or removed from a corresponding row without the concern of violating CTC requirements between two outlets of different types.

However, similar to the rPDU 200, back caps affixed to certain types of outlets (e.g., C13 type outlets) in the outlet banks 404a-404c may become dislodged or removed, and arranging and organizing wires in an orderly fashion may be challenging. Moreover, both the rPDU 200 and rPDU 400 are constrained by a requirement that the outlets of the rPDUs 200, 400 be assembled at the time of manufacture. It may be preferable to manufacture separate modular rPDU components at the time of manufacturing, and subsequently assemble the modular rPDU components at a distribution center.

FIG. 5A illustrates a top view of an rPDU 500 including a plug 512 and several flexible and configurable outlet modules 502a-502c according to an embodiment. The rPDU 500 is configured to receive AC power via the plug 512 and distribute the AC power via the flexible and configurable outlet modules 502a-502c. Each of the flexible and configurable outlet modules 502a-502c includes a bank of eight outlets in one of two types, where the arrangement of the outlets may be specified by a customer.

For purposes of clarity, operation of the flexible and configurable outlet modules 502a-502c will be described with reference to the flexible and configurable outlet module 502c. However, it is to be appreciated that the principles described with reference to the flexible and configurable outlet module 502c are similarly applicable to the flexible and configurable outlet module 502a and to the flexible and configurable outlet module 502b.

Figure 5B:
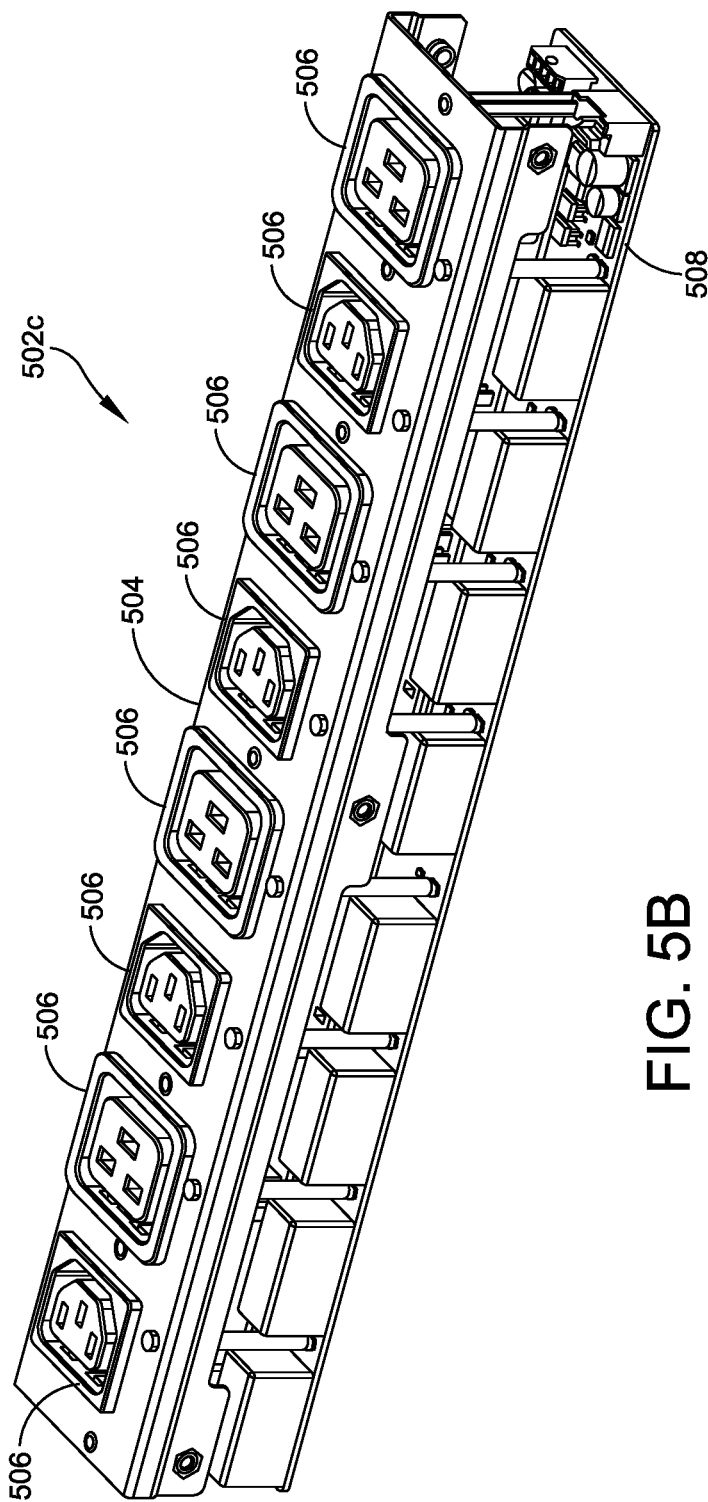
FIG. 5B illustrates a perspective view of an rPDU outlet module according to one embodiment.

FIG. 5B illustrates a top perspective view of the flexible and configurable outlet module 502c, hereinafter referred to as outlet module 502c, according to an embodiment. The outlet module 502c can be produced with several modular components to addresses the foregoing concerns. The outlet module 502c includes a faceplate 504, several outlets 506, and a flexible and configurable control board 508. FIG. 5C illustrates a bottom perspective view of the outlet module 502c, including the faceplate 504, the outlets 506, the flexible and configurable control board 508, and a flexible and configurable outlet board 510.

Figure 6:
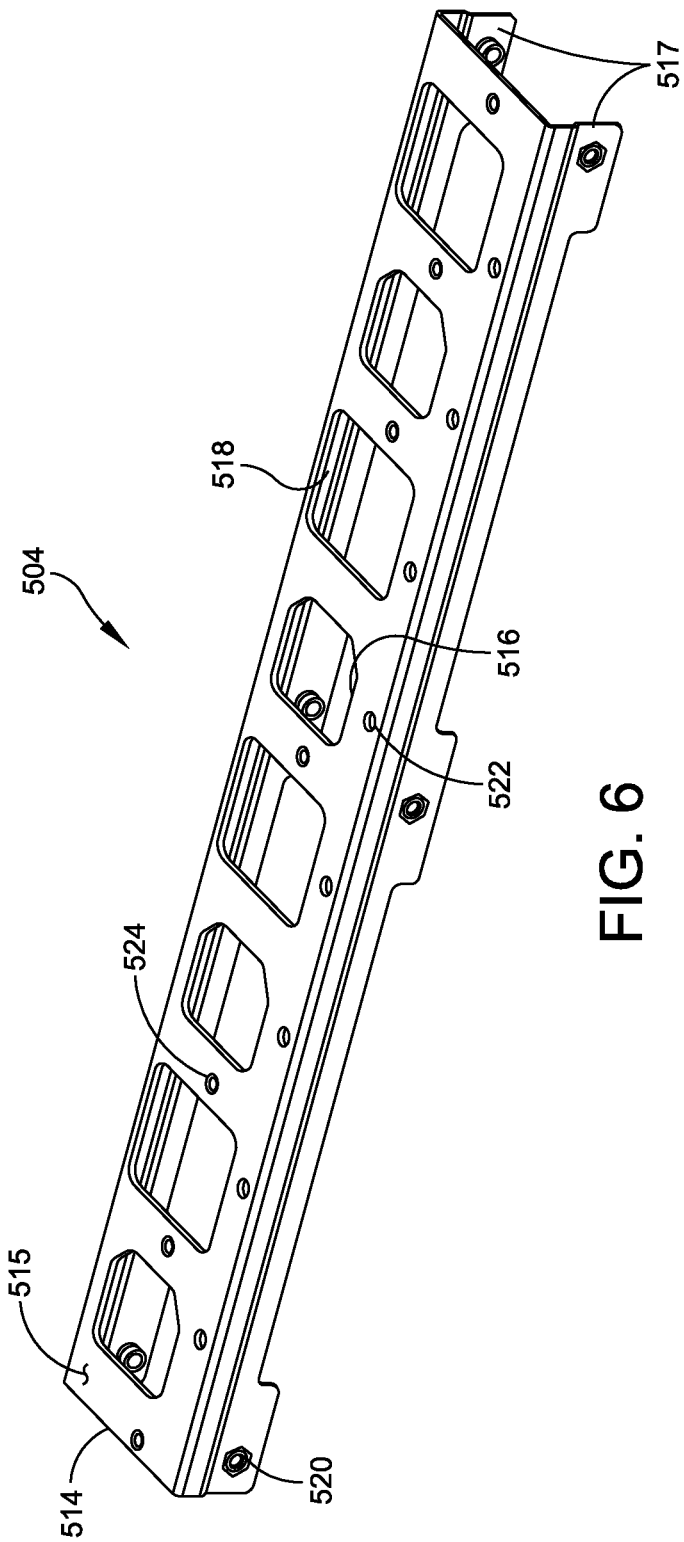
FIG. 6 illustrates a perspective view of an outlet module faceplate according to one embodiment.

The faceplate 504 retains components of the outlet module 502c and is discussed in greater detail below with respect to FIG. 6. The faceplate 504 may be manufactured with a specific configuration arrangement of outlet openings stamped thereon according to customer specifications, and shipped in a configured state to a distribution center. In alternate embodiments, the outlet openings may be manufactured using alternate methods. For example, the outlet openings may be laser cut into the faceplate 504.

Each of the outlets 506 includes a first end having female terminals designed to mate with a corresponding plug, and a second end having male terminals configured to mate with corresponding female terminals on the outlet board 510 from which to receive power, as discussed in greater detail below with respect to FIG. 7. Each of the outlets 506 is configured to be inserted into a corresponding opening stamped into the faceplate 504, and to lock into position to avoid becoming dislodged from the corresponding opening.

Figure 9:
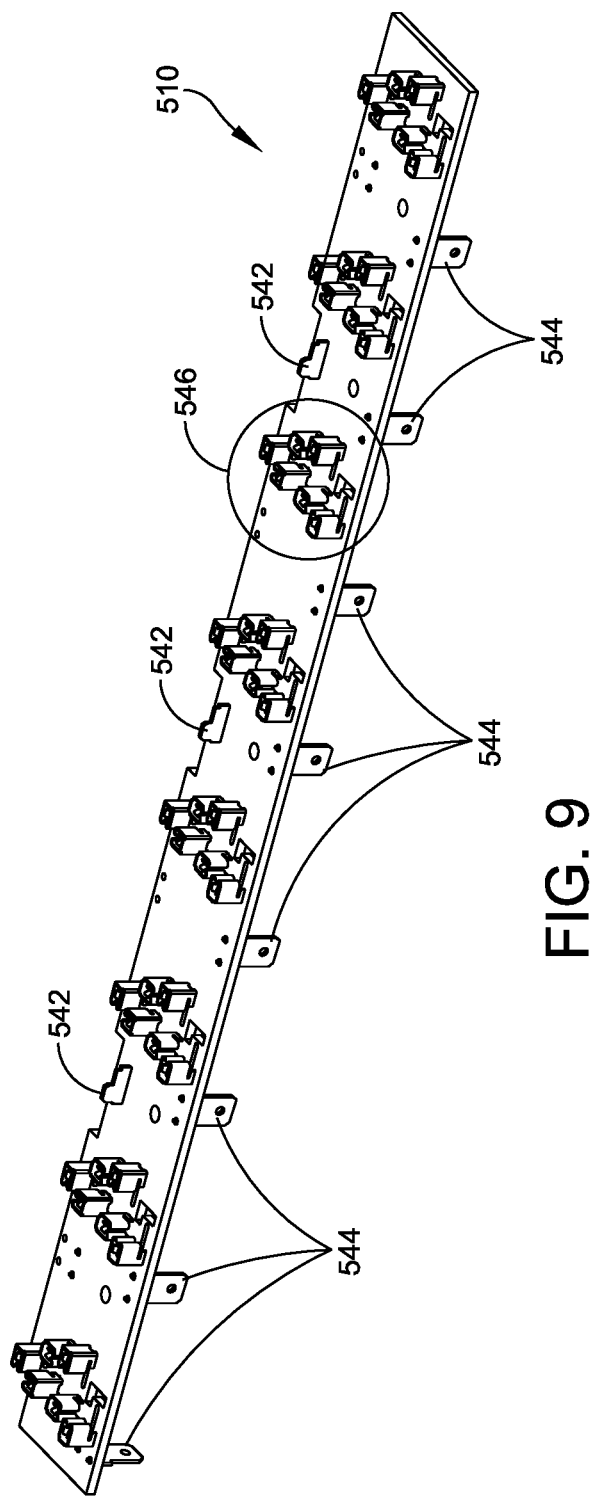
FIG. 9 illustrates a perspective view of an outlet board according to one embodiment.

In one embodiment, the flexible and configurable outlet board 510 is a PCB Assembly (PCBA) configured to mate with the outlets 506 and facilitate power distribution thereto, and is described in greater detail below with respect to FIG. 9. The flexible and configurable outlet board 510 is configured to mate with outlets having varied types in any arrangement (e.g., C13 and C19 type outlets arranged according to any permutation) without having any knowledge of the arrangement.

In one embodiment, the flexible and configurable control board 508 is a PCBA configured to mate with the flexible and configurable outlet board 510, and is described in greater detail below with respect to FIG. 14. The flexible and configurable control board 508 is configured to receive AC line potential power and distribute the AC line potential power to the outlets 506 via the flexible and configurable outlet board 510.

The faceplate 504 will now be described in greater detail with reference to FIG. 6. The faceplate 504 includes a body 514 having a front surface portion 515 and flanges 517. The front surface portion 515 includes several outlet openings including a first outlet opening 516 and a second opening 518 stamped into the front surface portion 515, several light pipes including a light pipe 522, and several fastener openings including a fastener opening 524. The flanges 517 include several fastener openings including a fastener opening 520.

Each outlet opening is configured to receive an outlet. The outlet openings are stamped into the front surface portion 515 in a shape selected to receive a specific type of outlet. For example, the first outlet opening 516 can receive a C13 type outlet, and the second outlet opening 518 can receive a C19 type outlet. The outlets may include a locking mechanism that secures the outlet into a respective outlet opening of the outlet openings, such that the outlet is not inadvertently removed or dislodged from a respective outlet opening.

As discussed above, the faceplate 504 may be received by a distributor from a manufacturer with the outlet openings stamped into the faceplate 504. A customer order may include a specific arrangement of outlet openings provided to a manufacturer, and the manufacturer manufactures the faceplate 504 having the outlet openings stamped into the faceplate 504 according to the customer order. The configured faceplate 504 is subsequently sent to the distributor.

In one example, the faceplate 504 may be constructed of 18 Ga cold rolled steel, measuring 2.185 in.×13.425 in., and may support 1.6 in. CTC spacing for a bank of eight outlets. For a bank of eight outlets, up to 256 different permutations of outlet configurations are possible where two different types of outlets are available.

The fastener opening 520 is configured to receive a fastener, such as a female threaded fastener, to affix the faceplate 504 to a chassis of the rPDU 500. Additionally, the female threaded fastener provides electrical bonding for earth ground between the chassis of the rPDU 500 and the outlet module 502c. The light pipe 522 is used to display a visual status indicator of a corresponding status of the outlet. For example, the light pipe 522 corresponds to the first outlet opening 516 and may indicate whether an outlet secured in the first outlet opening 516 is energized to provide electrical power. The light pipe 522 may be connected to a Light-Emitting Diode (LED) configured to emit light (e.g., a green light) when power is available from an outlet secured in the first outlet opening, and to not emit light when power is unavailable from the outlet secured in the first outlet opening. In some embodiments, the light pipe 522 may be omitted during the manufacturing process depending on customer requirements.

The fastener opening 524 is configured to receive a male threaded fastener, which may be configured to receive a standoff. In one example, the male threaded fastener may be configured to receive a ³⁄₁₆ in. hex standoff fastener measuring 1.11 in. long. In addition to securing the outlet board 510 to the faceplate 504, the standoffs provide electrical bonding for earth ground between the faceplate 504, the outlet board 510, and outlets secured in the outlet openings.

The outlets 506 will now be described in greater detail with respect to FIG. 7. FIG. 7 illustrates a first outlet 526 and a second outlet 528. The first outlet 526 is a C13 type outlet and includes female receptacle openings 530 to mate with a C14 type plug, male mating terminals 532 to mate with an outlet board such as the outlet board 510, and a locking mechanism 534. The second outlet 528 is a C19 type outlet and includes female receptacle openings 536 to mate with a C20 type plug, male mating terminals 538 to mate with an outlet board such as the outlet board 510, and a locking mechanism 540. In one example, the male mating terminals 532 and the male mating terminals 538 are 0.250 in. male FASTON tabs.

Figure 7:
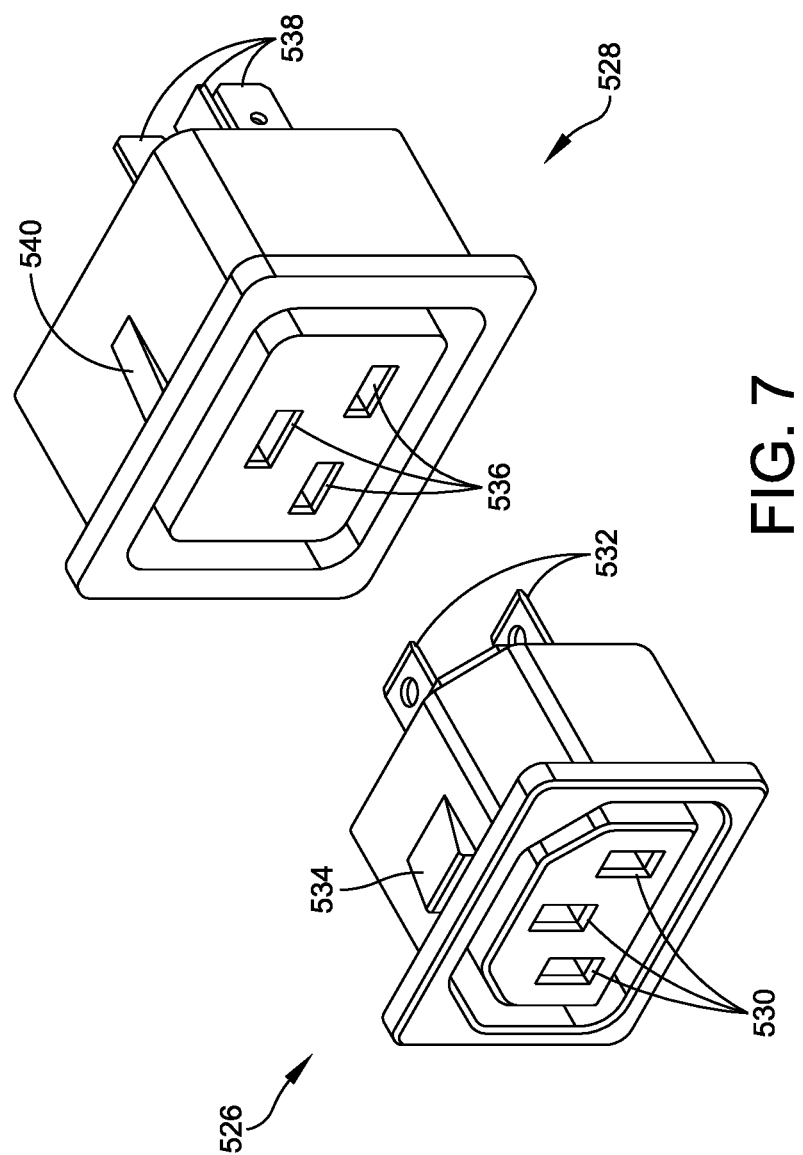
FIG. 7 illustrates a perspective view of a first outlet and a second outlet according to one embodiment.

In the embodiment illustrated by FIG. 7, the locking mechanism 534 and the locking mechanism 540 each may be embodied as a tapered, spring-loaded snap-in tab. This design permits the first outlet 526 and the second outlet 528, respectively, to be easily inserted into a corresponding one of the outlet openings, but prevents the first outlet 526 and the second outlet 528 from becoming easily dislodged.

Figure 8:
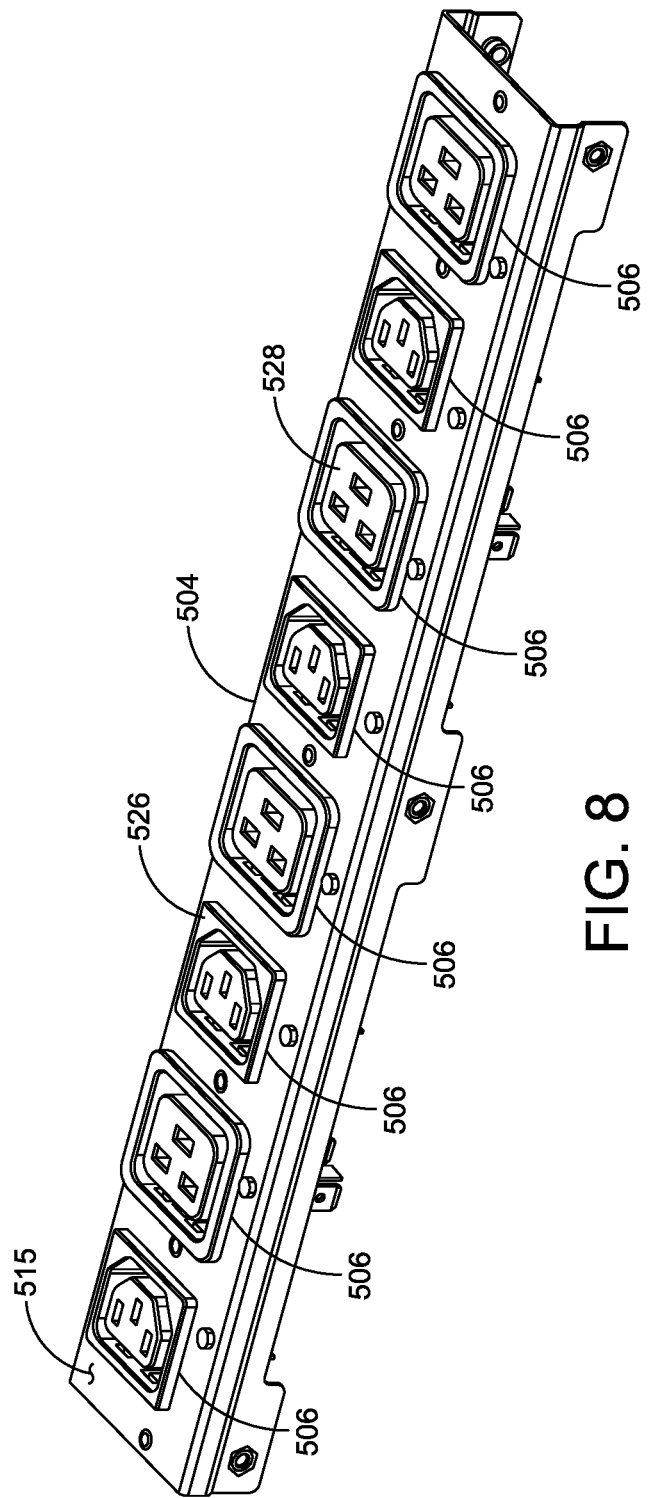
FIG. 8 illustrates a perspective view of the outlet module faceplate in combination with the outlets according to one embodiment.

FIG. 8 illustrates the faceplate 504 with the outlets 506, including the first outlet 526 and the second outlet 528, snapped into outlet openings on the front surface portion 515 of the faceplate 504. The locking mechanism 534 and the locking mechanism 540 are not accessible from the outside of the faceplate 504, thereby preventing the outlets from becoming easily dislodged. In other embodiments, however, alternate fastening mechanisms may be used. For example, the first outlet 526 and the second outlet 528 may be attached to the faceplate 504 using one or more threaded fasteners, permanently affixed using an adhesive material, or attached to the faceplate 504 using another method of attachment.

The flexible and configurable outlet board 510, hereinafter referred to as the outlet board 510, will now be described in greater detail with respect to FIG. 9. The outlet board 510 includes several bank jumpers, each indicated at 542, several AC line input tabs, each indicated at 544, and several groups of female outlet board terminals, including a group of female outlet board terminals indicated at 546.

The bank jumpers 542 are used to configure the outlet module 502c. For example, the bank jumpers 542 can be used to split the eight depicted outlets into four banks of two outlets each, two banks of four outlets each, or one bank of eight outlets. The AC line input tabs 544 are 0.250 in. male FASTON tabs configured to couple to, and receive AC line input from, corresponding female terminals on the control board 508. The group of female terminals 546 includes two sets of three female terminals, with a first set being configured to receive a first type of mating tab (e.g., the male mating terminals 532 of the first outlet 526) and a second set configured to receive a second type of mating tab (e.g., the male mating terminals 538 of the second outlet 528).

Figure 10:
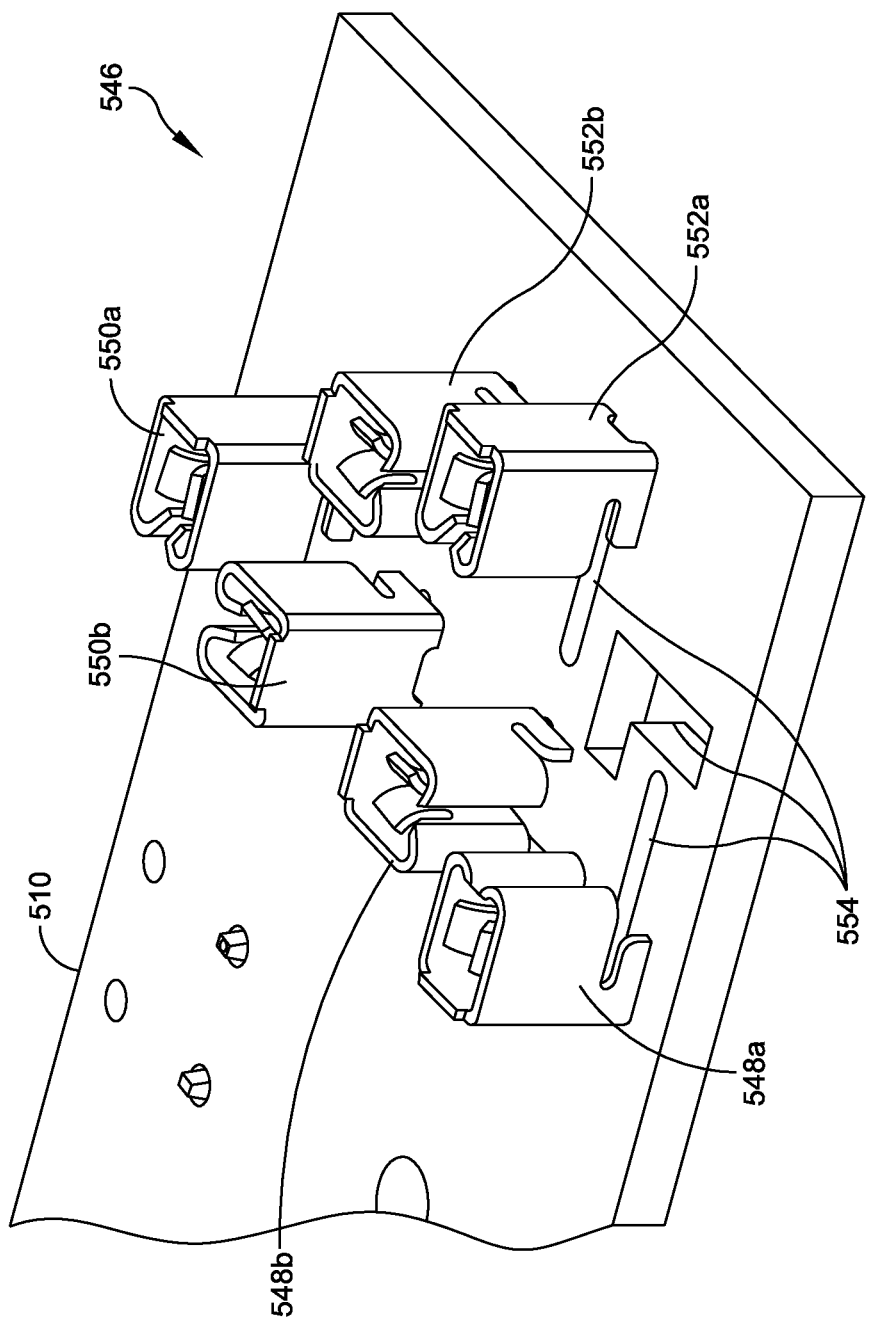
FIG. 10 illustrates a detailed view of outlet board female terminals according to one embodiment.

FIG. 10 illustrates a more detailed view of the group of female outlet board terminals 546 including the first set of three female terminals and the second set of three female terminals. The first set of three female terminals includes an AC line connection 548a, a neutral/AC line two connection 550a, and an earth ground connection 552a. The second set of three female terminals includes an AC line connection 548b, a neutral/AC line two connection 550b, and an earth ground connection 552b. The outlet board 510 also includes clearance slots 554 to receive C19 type outlet male FASTON tabs or outlet housing features.

Only one connection of each pair of female terminals 548-552 will be mechanically engaged at any one point in time, depending on which type of outlet is connected to the group of female outlet board terminals. For example, if a C19 type outlet is mated with the group of female outlet board terminals 546, the outlet's male tabs will mate with the first set of three female terminals including the AC line connection 548a, the neutral/AC line two connection 550a, and the earth ground connection 552a. Conversely, if a C13 type outlet is mated with the group of female outlet board terminals 546, the outlet's male tabs will mate with the second set of three female terminals including the AC line connection 548b, the neutral/AC line two connection 550b, and the earth ground connection 552b.

Figure 11:
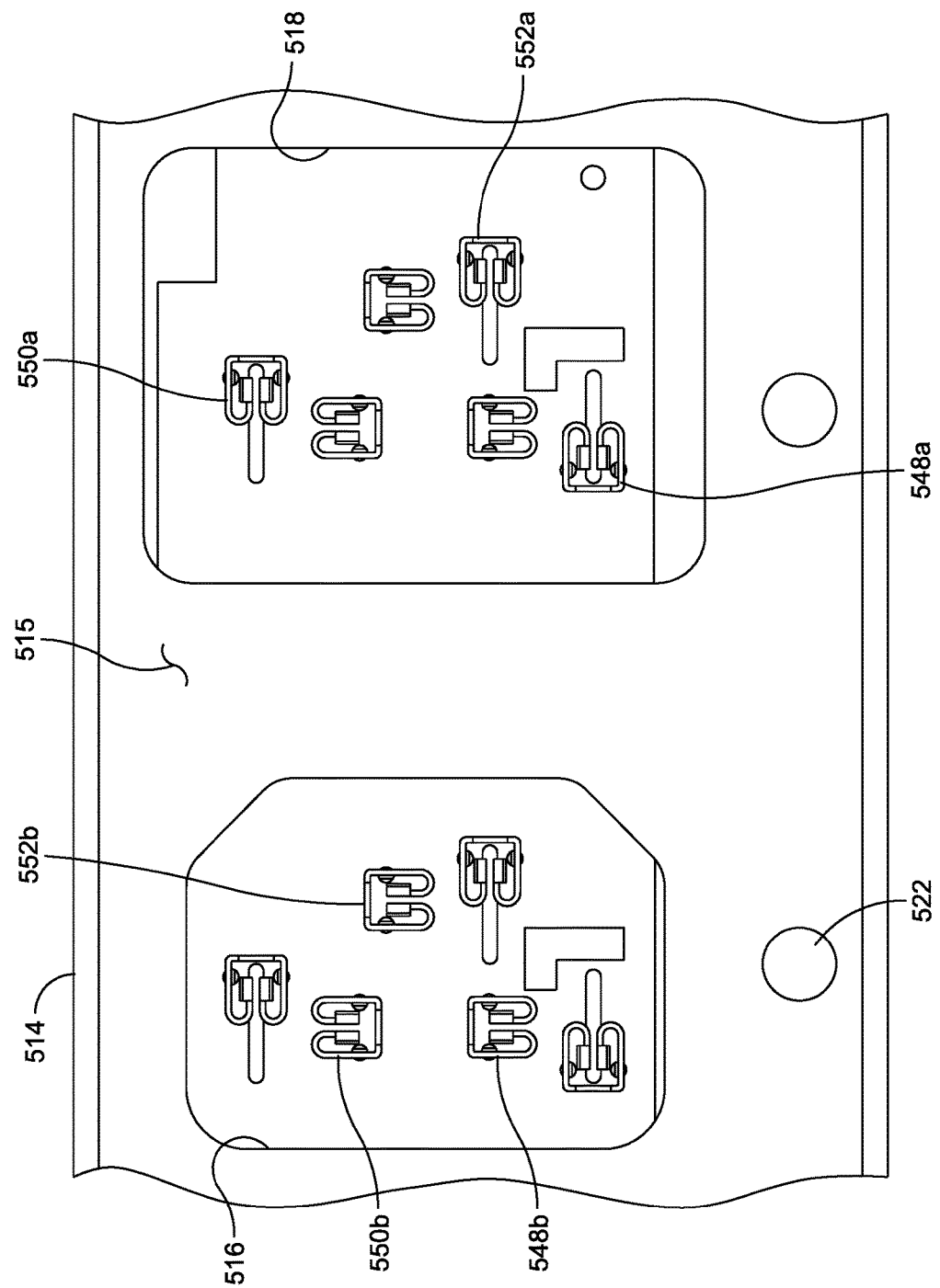
FIG. 11 illustrates a top view of outlet openings and groups of outlet board female terminals according to one embodiment.

FIG. 11 illustrates a top view of several groups of female outlet board terminals, in combination with the first outlet opening 516 and the second outlet opening 518. For clarity of illustration, the PCB upon which the several groups of female outlet board terminals are mounted is not shown, and the first outlet 526 and the second outlet 528 have been omitted.

Figure 12A:
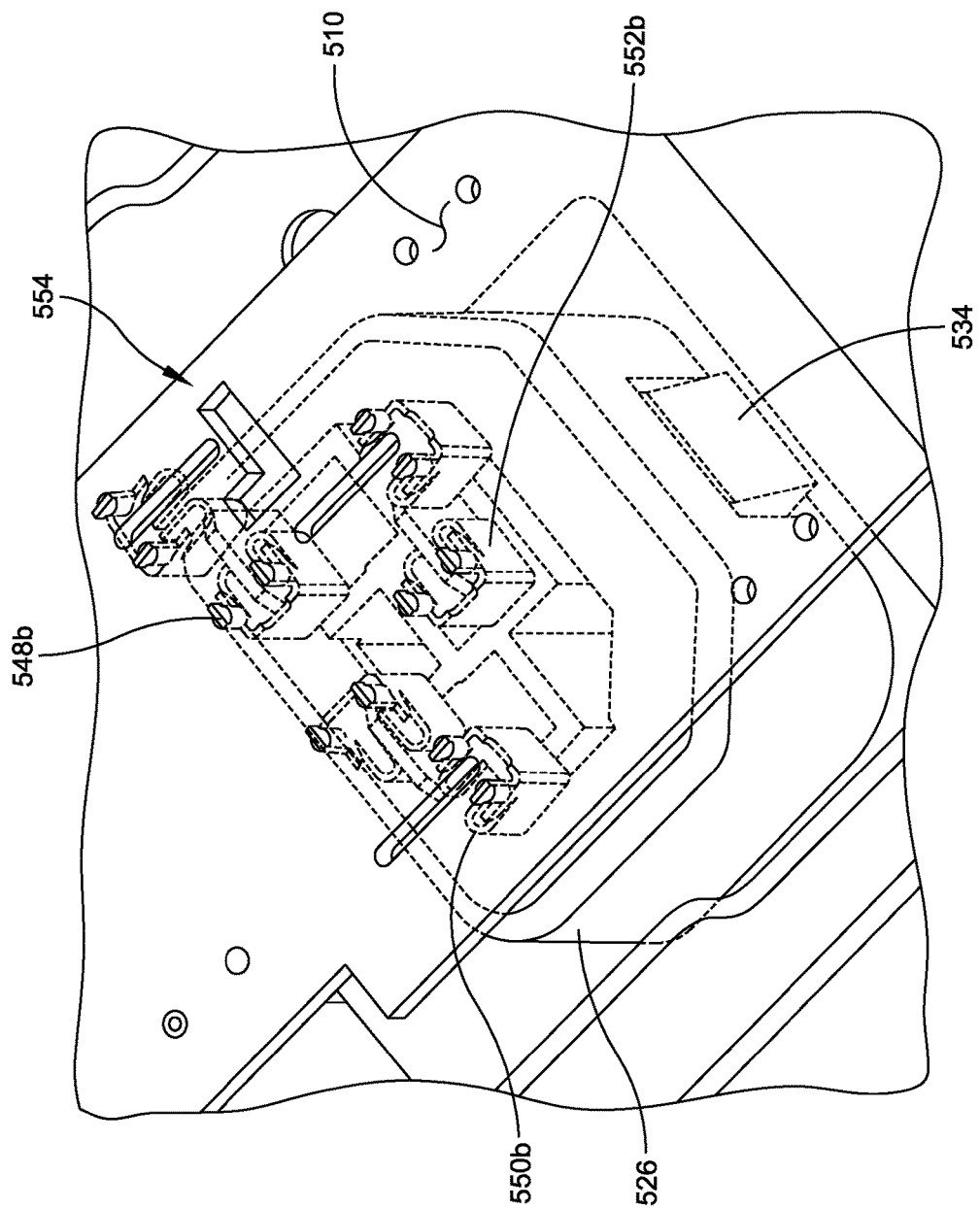
FIG. 12A illustrates a bottom perspective view of a portion of an outlet of a first type coupled to a group of outlet board female terminals according to one embodiment.

When the first outlet 526 (e.g., a C13 type outlet) is inserted into the first outlet opening 516, the male mating terminals 532 of the first outlet 526 will mechanically engage with the AC line connection 548b, the neutral/AC line two connection 550b, and the earth ground connection 552b. FIG. 12A illustrates a back perspective view of the first outlet 526 mechanically engaged with the AC line connection 548b, the neutral/AC line two connection 550b, and the earth ground connection 552b for further illustration of the principles discussed above.

Figure 12B:
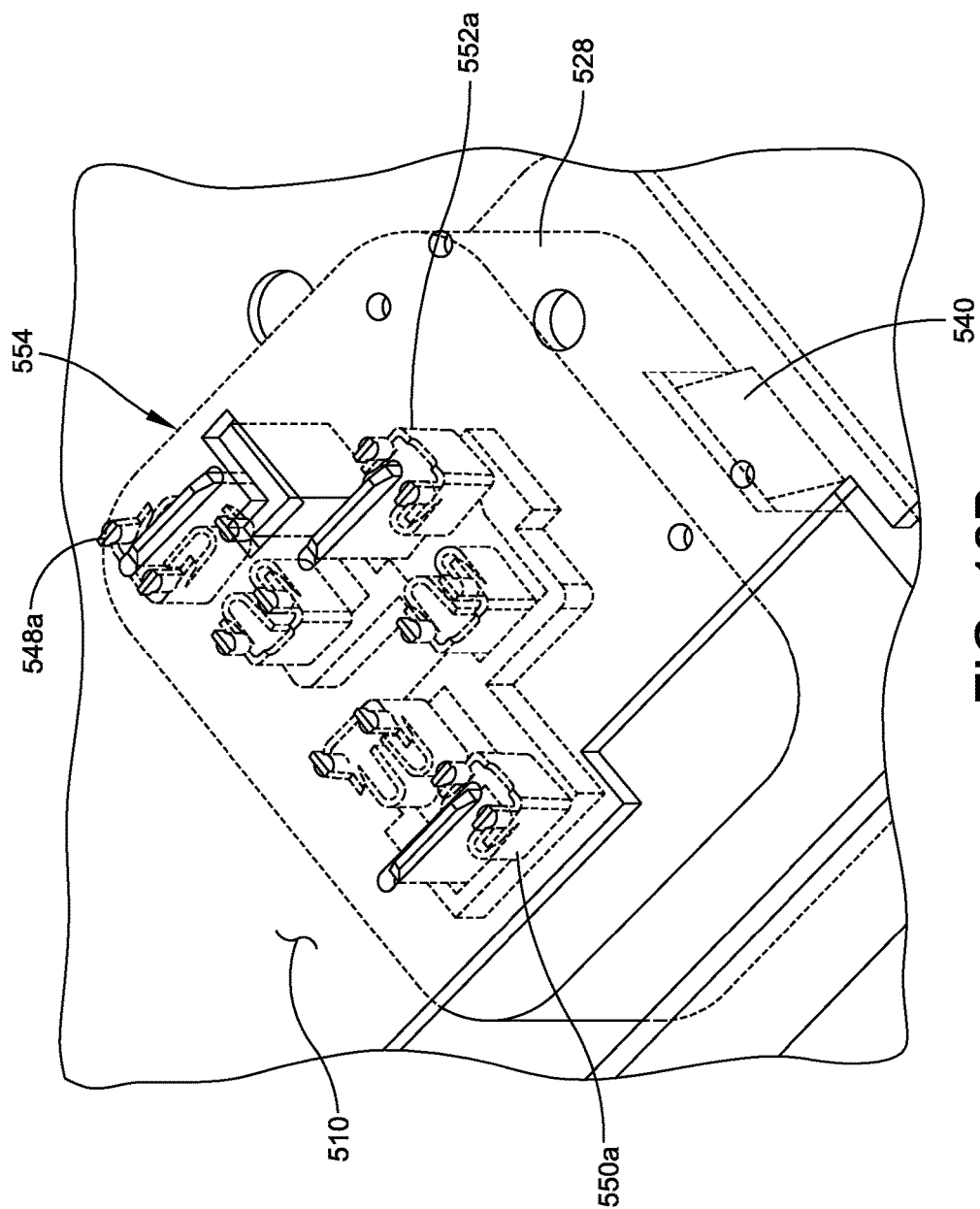
FIG. 12B illustrates a bottom perspective view of a portion of an outlet of a second type coupled to a group of outlet board female terminals according to one embodiment.

When the second outlet 528 (e.g., a C19 type outlet) is inserted into the second outlet opening 518, the male mating terminals 538 of the second outlet 528 will mechanically engage the AC line connection 548a, the neutral/AC line two connection 550a, and the earth ground connection 552a. FIG. 12B illustrates a back perspective view of the second outlet 528 mechanically engaged with the AC line connection 548a, the neutral/AC line two connection 550a, and the earth ground connection 552a for further illustration of the principles discussed above.

It is to be appreciated that the outlet board 510 is configured to mate with multiple types of outlets, such as C13 and C19 type outlets, regardless of the number and arrangement of the multiple types of outlets, because each group of female outlet board terminals is designed to mate with either a C13 or C19 type outlet. This allows a highly flexible system, because the outlet board 510 is universally applicable to any outlet module (e.g., any one of the outlet modules 502a-502c) and does not require any customization regardless of the arrangement of the multiple types of outlets.

Figure 13:
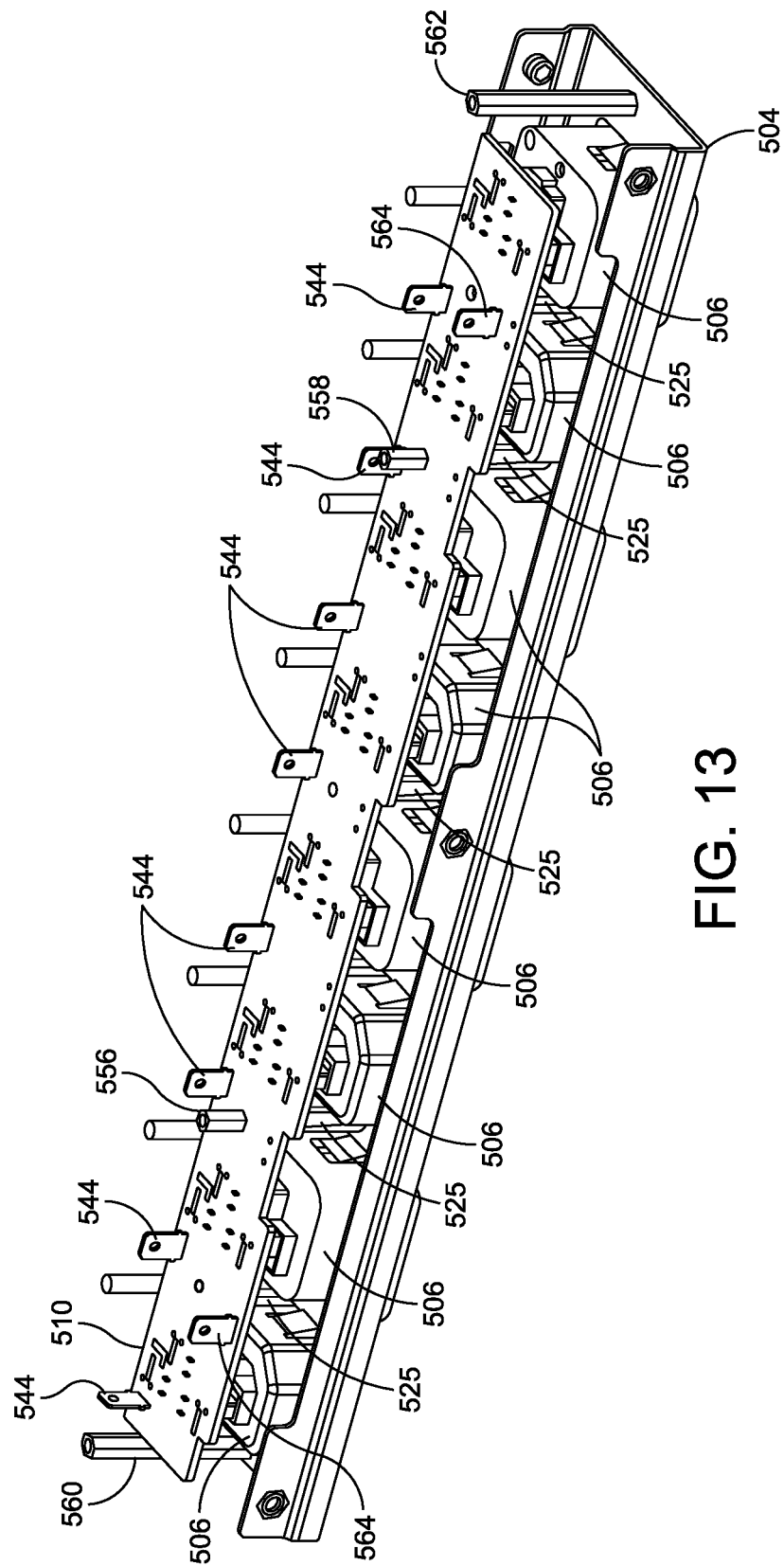
FIG. 13 illustrates a bottom perspective view of the outlet module, several outlets, and the outlet board according to one embodiment.

FIG. 13 illustrates a bottom perspective view of the faceplate 504, the outlets 506, and the outlet board 510 connected together. As discussed above, fastener openings, such as the fastener opening 524, are provided in the outlet board 510 to receive standoffs to couple the faceplate 504 to the outlet board 510. For example, FIG. 13 illustrates a plurality of first hex standoffs 525, a second hex standoff 556, and a third hex standoff 558.

Each of the plurality of first hex standoffs 525 is configured to be coupled between the faceplate 504 and the outlet board 510. The second hex standoff 556 and the third hex standoff 558 are configured to be coupled to respective hex standoffs of the plurality of first hex standoffs 525 at a first end. For example, the second hex standoff 556 is coupled to a respective hex standoff of the plurality of first hex standoffs 525 via the fastener opening 524 in the outlet board 510. Additionally, the second hex standoff 556 and the third hex standoff 558 are configured to be coupled to the control board 508 at a second end. In one example, the second hex standoff 556 and the third hex standoff 558 are 3/16 in. hex standoffs measuring 0.375 in. long to provide electrical bonding for earth ground between the control board 508, the outlet board 510, the plurality of first hex standoffs 525, and the faceplate 504.

FIG. 13 further illustrates a fourth hex standoff 560 and a fifth hex standoff 562 provided at respective ends of the faceplate 504 to connect the faceplate 504 to the control board 508 as discussed in greater detail below. In one example, the fourth hex standoff 560 and the fifth hex standoff 562 are 3/16 in. hex standoffs measuring 1.583 in. long to provide electrical bonding for earth ground between the control board 508 and the faceplate 504.

FIG. 13 further illustrates the AC line input tabs 544, which are configured to receive AC line input from the control board 508. The outlet board 510 also includes a neutral/AC line two input tab 564, which is configured to be coupled to a neutral/AC line two input as discussed in greater detail below with respect to FIG. 15. In one embodiment, the AC line input tabs 544 and the neutral/AC line two input tab 564 are 0.250 in. FASTON tabs, and are capable of accommodating 3 oz copper traces which support a 12 A supply for C13 type outlets and a 16 A supply for C19 type outlets.

Figure 14:
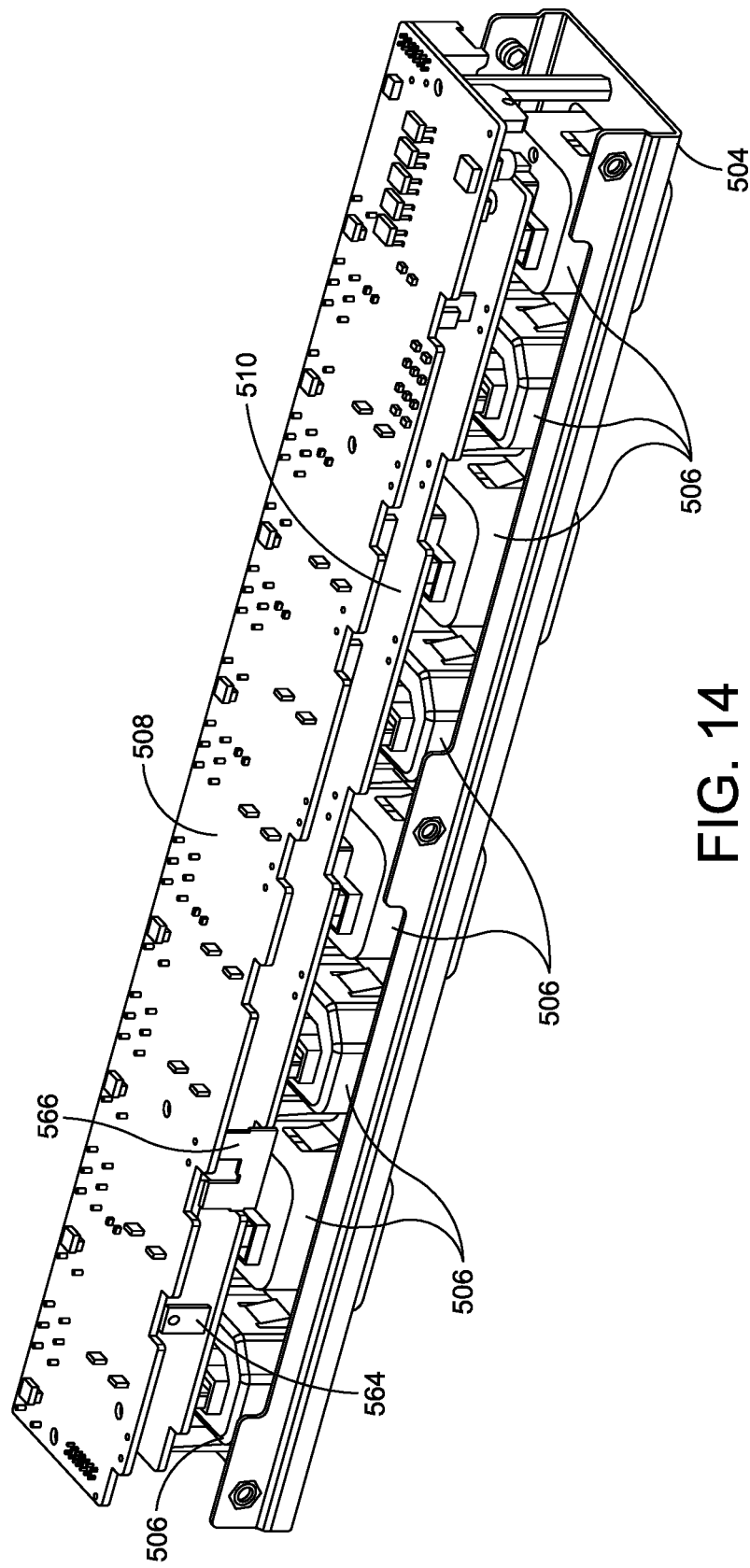
FIG. 14 illustrates a bottom perspective view of the outlet module, the outlets, the outlet board, and the control board according to one embodiment.

FIG. 14 illustrates a bottom perspective view of the faceplate 504, the outlets 506, the control board 508, and the outlet board 510 connected together. The control board 508 includes an AC line input tab 566 configured to be coupled to an AC line input. As illustrated, the control board 508 includes a notch above the AC line input tab 566 such that the physical footprint of the control board 508 does not obstruct the AC line input tab 566 from being connected to an AC line input. The control board 508 is therefore able to receive AC line input power via the AC line input tab 566 and distribute the AC line power to the outlet board 510 via the AC line input tabs 544, which are configured to engage female terminals (not illustrated) affixed to the control board 508. In one embodiment, the female terminals are FASTON receptacles, similar to the female terminals 546 on the outlet board 510. Similarly, the control board 508 includes a notch above the neutral/AC line two input tab 564 such that the physical footprint of the control board 508 does not obstruct the neutral/AC line two input tab 564 from being connected to a neutral/AC line two input.

Figure 15:
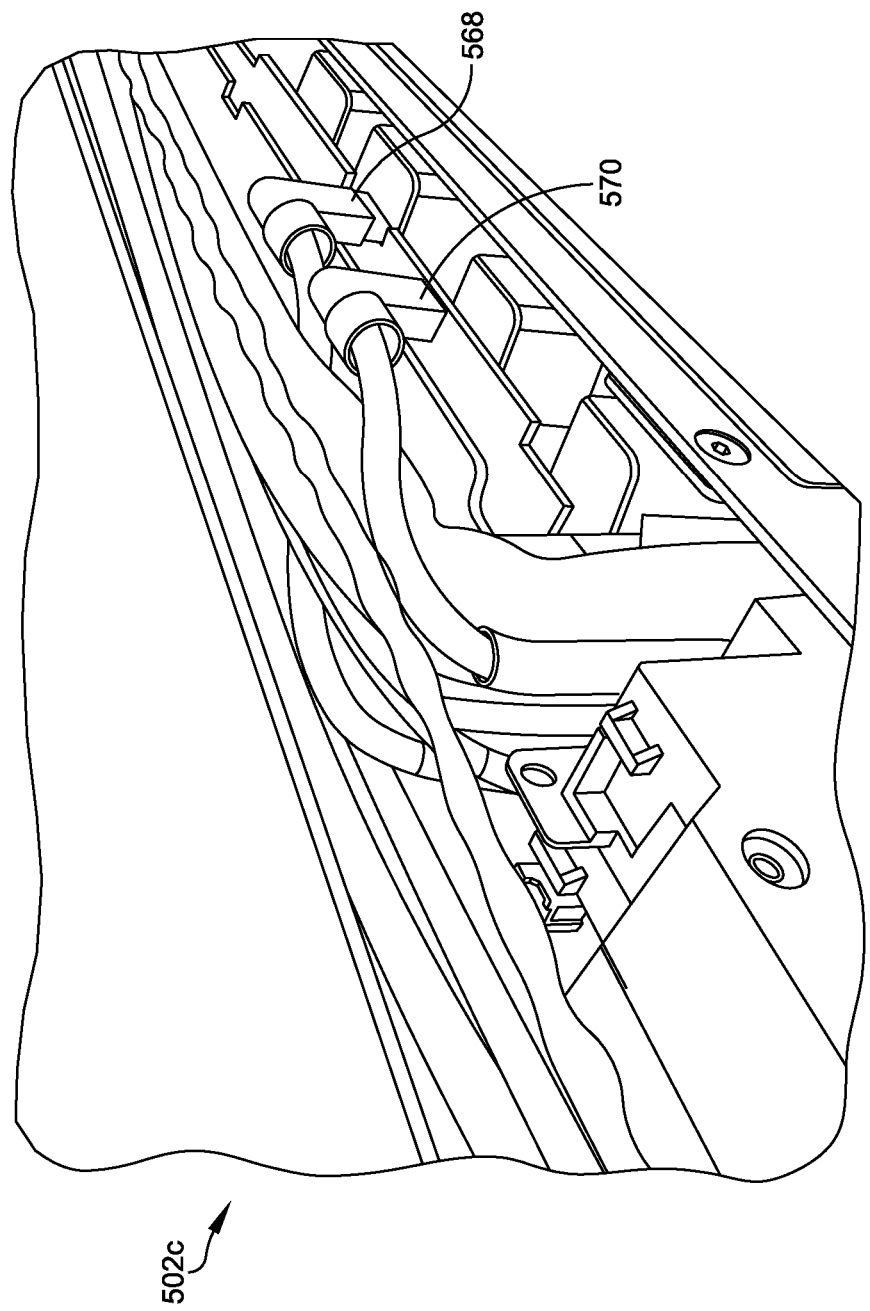
FIG. 15 illustrates a bottom perspective view of a portion of the rack Power Distribution Unit (rPDU) including the outlet module with routed electrical harnessing according to one embodiment.

FIG. 15 illustrates a bottom perspective view of the outlet module 502c. The outlet module 502c is configured to connect to, and receive AC power from, an AC line input 568 connected to the AC line input tab 566, and a neutral/AC line two input 570 connected to the neutral/AC line two input tab 564. The AC line input 568 and the neutral/AC line two input 570, in turn, receive AC power from AC power provided to the rPDU 500 via the plug 512. As illustrated by FIG. 15, the wiring arrangement connected to the outlet module 502c is significantly more organized than the wiring arrangement illustrated in FIG. 3, thereby making maintenance and troubleshooting of the outlet module 502c significantly more convenient.

Although the foregoing discussion has been directed primarily to the outlet module 502c, it is to be appreciated that the principles discussed herein are similarly applicable to the outlet module 502a and the outlet module 502b. Moreover, although the rPDU 500 has been illustrated as having one row of three outlet modules 502a-502c, it is to be appreciated that the rPDU 500 may include any number of outlet modules arranged in any number of rows. For example, in one alternate embodiment, an rPDU constructed according to the foregoing disclosure could be configured to include seven outlet modules for a total of 56 outlets, arranged in two rows. A user's available space for the rPDU may be the only limit on the size of the rPDU. In one example, the rPDU 500 measures approximately 72 in.× 2.185 in., not including the length of the plug 512 and the wire attached thereto.

Although the foregoing discussion has made reference to C13 and C19 type outlets, alternate types of outlets are similarly within the scope of the present disclosure. For example, the embodiments discussed above can support C15 and C21 type outlets, which are high-temperature variants of the C13 and C19 type outlets, respectively. Burland C13 and C19 type outlets may also be supported where the outlets are provided with a corresponding outlet PCB and a deeper outlet chassis to support the size of the outlets.

Alternate embodiments can also support NEMA 5-15R and 5-20R type outlets where the outlets are provided with a corresponding outlet PCB that includes female terminals arranged to receive the NEMA 5-15R and 5-20R type outlet male FASTON tabs. Any number (e.g., more or less than two) and type (e.g. NEMA 5-15R, C13, etc.) of outlets may be combined using the principles discussed herein.

Furthermore, alternate embodiments are contemplated which utilize uniform outlet openings. As discussed above with respect to FIG. 6, the faceplate 504 includes several outlet openings capable of receiving outlets of two types. For example, outlet opening shapes can be stamped into the faceplate 504 to enable the first outlet opening 516 to receive a first type of outlet, and the second outlet opening 518 to receive a second type of outlet, enabling up to 256 different outlet combination arrangements.

Figure 16:
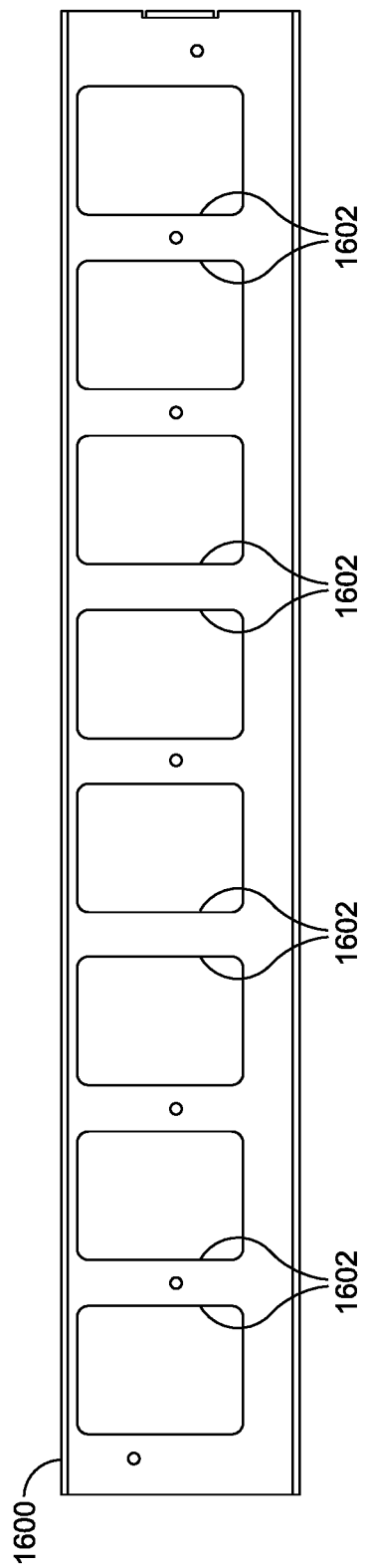
FIG. 16 illustrates a top view of an outlet module faceplate according to one embodiment.

FIG. 16 illustrates an outlet module faceplate 1600 according to another embodiment. The outlet module faceplate 1600 includes several uniform outlet openings, each indicated at 1602. Each outlet opening 1602 is configured to receive either a first outlet of a first type or an outlet adapter configured to adapt the shape of a second outlet of a second type to the shape of the first outlet of the first type.

For example, each of the uniform outlet openings 1602 can be configured to receive either a C19 type outlet or an outlet adapter configured to adapt the shape of a C13 type outlet to the shape of the C19 type outlet. Each of the uniform outlet openings 1602 can measure 29.50 mm×38.20 mm (+0.1 mm/−0.0 mm), consistent with the requirements for mounting a standard C19 panel mounted outlet.

Figure 17:
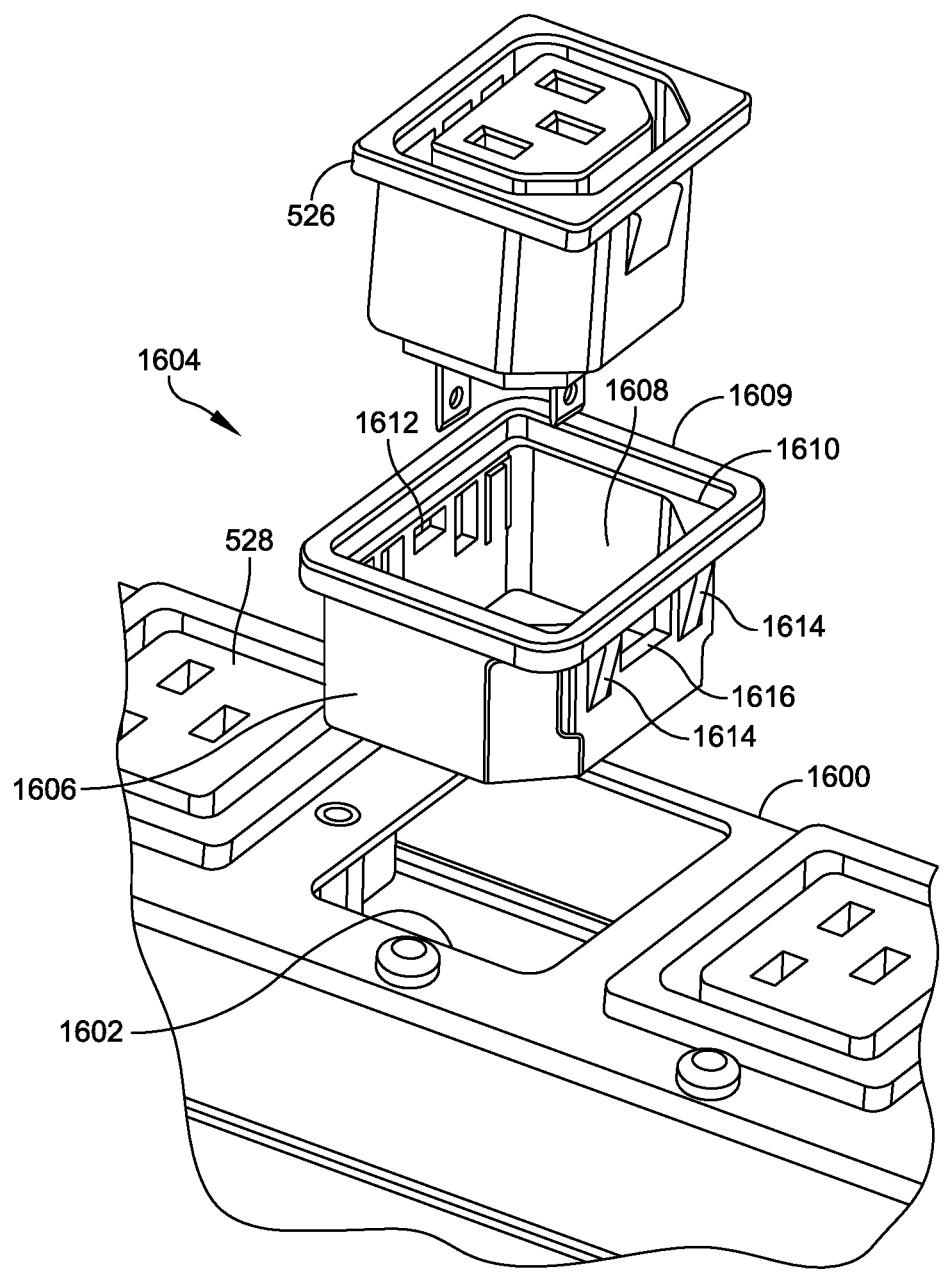
FIG. 17 illustrates a perspective view of an outlet, an outlet adapter, and the outlet module faceplate according to one embodiment.

FIG. 17 illustrates an outlet adapter generally indicated at 1604 configured to adapt the shape of the first outlet 526 of the first type to the shape of an outlet opening 1602 (e.g., a C19 type outlet opening) of the outlet module faceplate 1600. The outlet adapter 1604 includes a body 1606 having a cavity 1608 to receive the first outlet 526, a lip 1609 disposed along an upper edge of the body 1606 to prevent the outlet adapter 1604 from passing beyond a face of the outlet opening 1602, and a shelf 1610 to prevent the first outlet 526 from passing beyond a face of the outlet adapter 1604.

The outlet adapter 1604 further includes a V-lock opening 1612 to receive a retaining cord operable to prevent the retaining cord from becoming dislodged from the first outlet 526, a locking mechanism 1614 to retain the outlet adapter 1604 in the outlet opening 1602, and an opening 1616 to receive an outlet locking mechanism (e.g., the locking mechanism 534) to prevent the first outlet 526 from becoming dislodged from the cavity 1608.

In one example, the outlet adapter 1604 is constructed from Underwriters Laboratories (UL)-approved Nylon 6 material, is filled approximately 20% with glass, and has a V-2 flammability rating. The physical profile of the outlet adapter 1604 can be constructed to fit into a corresponding outlet opening. For example, in one embodiment, the outlet opening can be a 29.50 mm×38.20 mm opening configured to receive a C19 type outlet.

Figure 18:
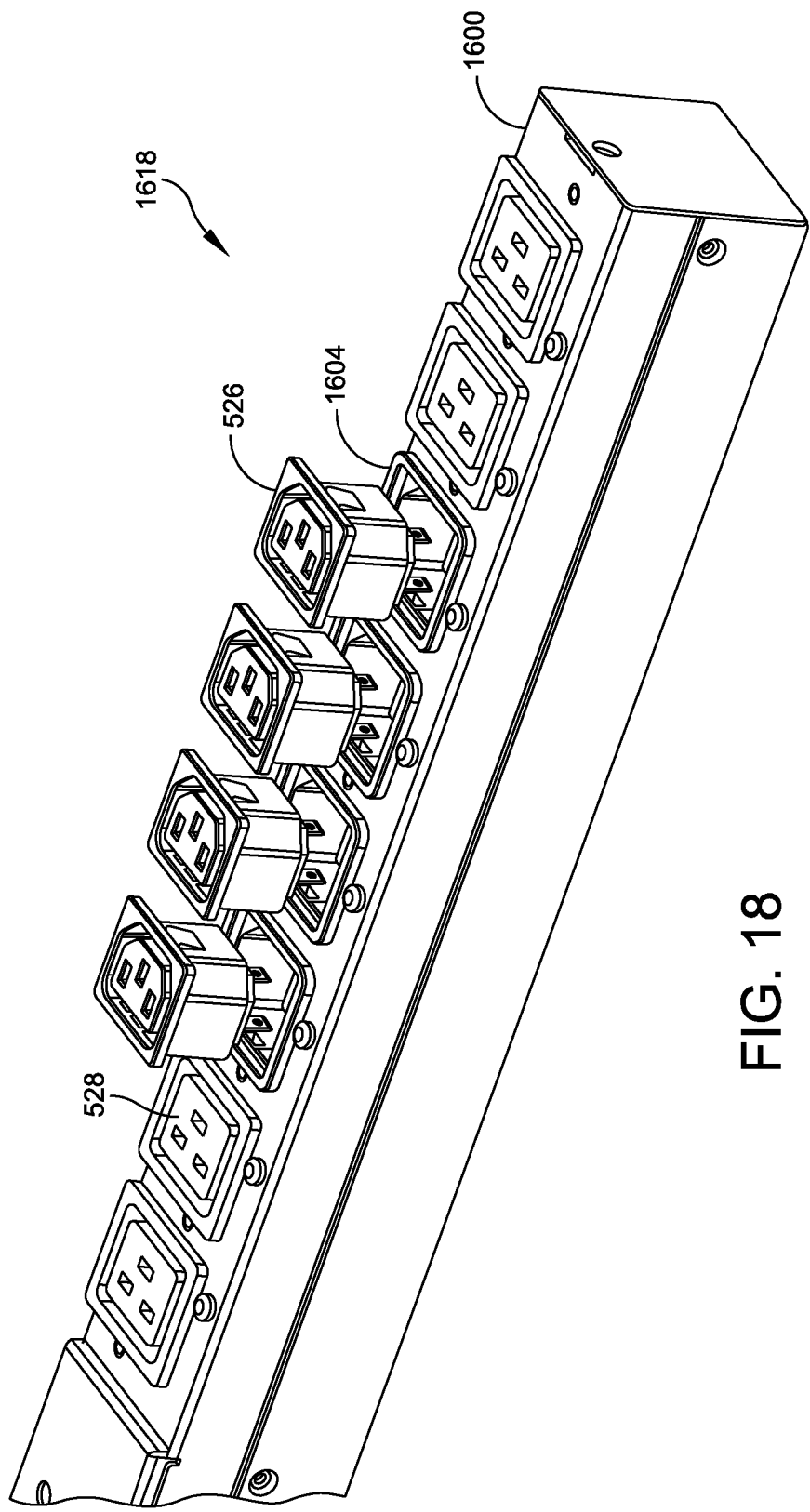
FIG. 18 illustrates a perspective view of a portion of the outlet module faceplate in combination with outlet adapters and outlets according to one embodiment.

FIG. 18 illustrates a bank of outlets 1618 including the first outlet 526 of the first type in combination with the outlet adapter 1604, and the second outlet 528 of the second type, fitted into uniform outlet openings of the outlet module faceplate 1600. Because the outlet module faceplate 1600 may be manufactured and stamped without any knowledge of customer requirements, the manufacturing process may be streamlined significantly.

Figure 19:
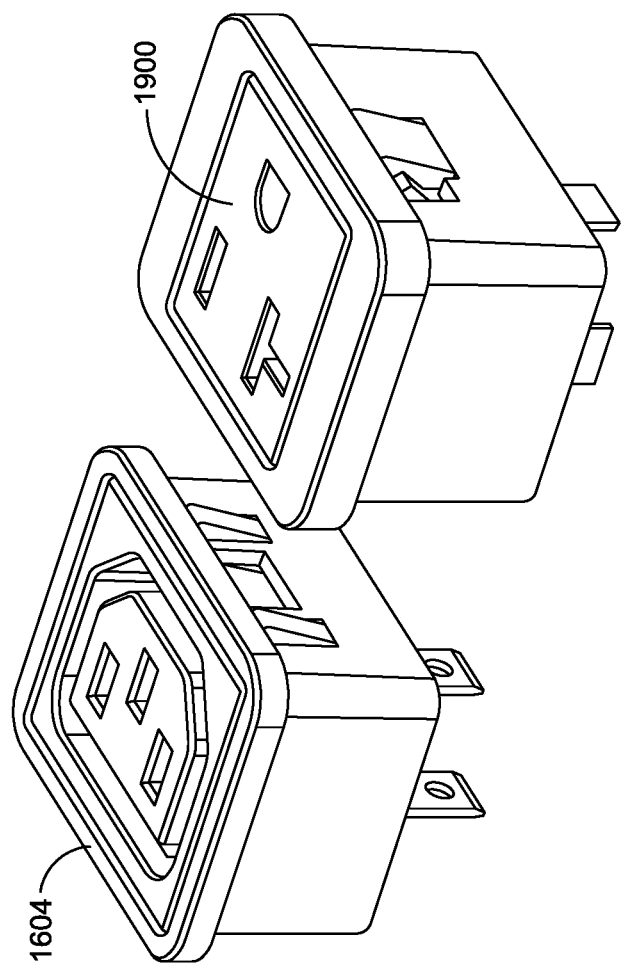
FIG. 19 illustrates outlets fitted in respective outlet adapters according to one embodiment.

Furthermore, although the outlet adapter 1604 discussed above is configured to adapt a C13 type outlet to a C19 type outlet opening, alternate adapters are similarly contemplated which adapt any one outlet type to any other outlet type. For example, FIG. 19 illustrates an outlet adapter 1900 configured to adapt a NEMA 5-20R type outlet to a C19 type outlet opening, alongside the outlet adapter 1604.

Thus, it should be appreciated that flexible and configurable power distribution solutions have been described. An rPDU having modular components which can be configured and assembled downstream from a manufacturing facility allow more flexible solutions and a faster turn-around time to customer specifications, enabling a leaner manufacturing process. To further standardize the rPDU, outlet adapters can be employed to enable outlets to adapt to variously-sized outlet openings.

Having thus described several aspects of at least one embodiment, it is to be appreciated that various alterations, modifications, and improvements will readily occur to those skilled in the art. Such alterations, modifications, and improvements are intended to be part of this disclosure and are intended to be within the scope of the invention. Accordingly, the foregoing description and drawings are by way of example only, and the scope of the invention should be determined from proper construction of the appended claims, and their equivalents.

What is claimed is:

1. A rack power distribution unit having one or more outlet modules, each outlet module comprising:
 a body having a plurality of outlet openings;
 a plurality of outlets configured to be inserted into, and retained within, the plurality of outlet openings;
 an outlet board configured to be coupled to, and distribute power to, the plurality of outlets; and
 a control board configured to be coupled to, and distribute power to, the outlet board,
 wherein the outlet board is configured to be coupled to a first outlet of a first type and a second outlet of a second type, and
 wherein the outlet board includes a plurality of groups of outlet board terminals, each group of outlet board terminals being associated with a single outlet of the plurality of outlets, and including:
  a first set of outlet board terminals configured to be coupled to the first outlet of the first type; and
  a second set of outlet board terminals configured to be coupled to the second outlet of the second type, the second set of outlet board terminals being different than the first set of outlet board terminals.

2. The rack power distribution unit of claim 1, wherein the plurality of outlet openings is configured to accommodate at least 256 different configurations of outlet openings.

3. The rack power distribution unit of claim 1, wherein the plurality of outlets includes a C13 type outlet and a C19 type outlet, and wherein the plurality of outlet openings includes a first outlet opening configured to receive the C13 type outlet, and a second outlet opening configured to receive the C19 type outlet.

4. The rack power distribution unit of claim 1, wherein each outlet of the plurality of outlets includes a locking tab configured to allow a respective outlet to be inserted into a respective outlet opening of the plurality of outlet openings and to prevent the respective outlet from being removed from the respective outlet opening.

5. The rack power distribution unit of claim 1, further comprising an outlet adapter configured to be inserted into, and retained within, a respective outlet opening of the plurality of outlet openings.

6. The rack power distribution unit of claim 5, wherein the outlet adapter is configured to enable the first outlet of the first type to be inserted into an outlet opening of the plurality of outlet openings configured to receive the second outlet of the second type.

7. The rack power distribution unit of claim 5, wherein the outlet adapter includes a locking tab configured to allow the outlet adapter to be inserted into a respective outlet opening of the plurality of outlet openings and prevent the outlet adapter from being removed from the respective outlet opening.

8. The rack power distribution unit of claim 5, wherein each outlet opening of the plurality of outlet openings is substantially identical in size, and wherein each outlet opening of the plurality of outlet openings is configured to receive one of the outlet adapter and the second outlet of the second type.

9. The rack power distribution unit of claim 1, each outlet module further comprising a plurality of rows of outlets.

10. A rack power distribution unit including at least one outlet module, the at least one outlet module comprising:
 a body including a plurality of outlets;
 means for receiving, and retaining, the plurality of outlets; and
 means for distributing power received from a power source to the plurality of outlets,
  wherein the means for distributing power is configured to be coupled to a first outlet of a first type and a second outlet of a second type, and
  wherein the means for distributing power includes a plurality of groups of outlet board terminals, each group of outlet board terminals being associated with a single outlet of the plurality of outlets, and including:
   a first set of outlet board terminals configured to be coupled to the first outlet of the first type; and
   a second set of outlet board terminals configured to be coupled to the second outlet of the second type, the second set of outlet board terminals being different than the first set of outlet board terminals.

11. The rack power distribution unit of claim 10, wherein the plurality of outlets includes a C13 type outlet and a C19 type outlet.

12. The rack power distribution unit of claim 11, wherein the means for receiving, and retaining, the plurality of outlets includes means for receiving and retaining the C13 type outlet, and means for receiving and retaining the C19 type outlet.

13. The rack power distribution unit of claim 10, wherein each outlet of the plurality of outlets includes a locking tab configured, in combination with the means for receiving and retaining the plurality of outlets, to allow a respective outlet to be received by the means for receiving and retaining the plurality of outlets and to prevent the respective outlet from being removed from the means for receiving and retaining the plurality of outlets.

14. The rack power distribution unit of claim 10, wherein the means for receiving and retaining the plurality of outlets includes means for receiving and retaining an outlet of the first type, further comprising means for adapting an outlet of the second type to be received and retained by the means for receiving and retaining the outlet of the first type.

15. The rack power distribution unit of claim 14, wherein the outlet of the first type is a C19 type outlet, and wherein the outlet of the second type is a C13 type outlet.

16. The rack power distribution unit of claim 14, wherein the means for adapting an outlet of the second type to be received and retained by the means for receiving and retaining the outlet of the first type includes means for allowing the means for adapting an outlet of the second type to be received and retained by the means for receiving and retaining the outlet of the first type to be inserted into the means for receiving, and retaining, the plurality of outlets and for preventing the means for adapting an outlet of the second type to be received and retained by the means for receiving and retaining the outlet of the first type from being removed from the means for receiving, and retaining, the plurality of outlets.

17. The rack power distribution unit of claim 10, wherein the body includes a plurality of rows of outlets.

18. A rack power distribution unit having one or more outlet modules, each outlet module comprising:
- a body having a plurality of outlet openings, the plurality of outlet openings including a first outlet opening to receive an outlet of a first type;
- a plurality of outlets configured to be inserted into and retained within the plurality of outlet openings, the plurality of outlets including a first outlet of a second type;
- an outlet board configured to be coupled to, and distribute power to, the plurality of outlets;
- a control board configured to be coupled to, and distribute power to, the outlet board; and
- an outlet adapter comprising:
  - a body constructed to be inserted into the first outlet opening configured to receive the outlet of the first type, and having a lip to prevent the outlet adapter from passing through the first outlet opening,
  - a first cavity formed in the body to receive the first outlet of the second type,
  - a first locking tab to allow the outlet adapter to be inserted into the first outlet opening and prevent the outlet adapter from being removed from the first outlet opening, and
  - a second opening to allow a second locking tab of the first outlet of the second type to be inserted into the first cavity and prevent the first outlet of the second type from being removed from the first cavity.

19. The rack power distribution unit of claim 18, wherein the second type is a C13 type outlet or a 5-20R type outlet, and wherein the first type is a C19 type outlet.

* * * * *